US011935769B2

(12) United States Patent
Chiang et al.

(10) Patent No.: US 11,935,769 B2
(45) Date of Patent: Mar. 19, 2024

(54) INTERLOCK APPARATUS FOR CHEMICAL SUPPLY SYSTEM

(71) Applicant: TAIWAN SEMICONDUCTOR MANUFACTURING COMPANY LTD., Hsinchu (TW)

(72) Inventors: Fang-Pin Chiang, Taichung (TW); Tsung-Lin Tsai, Tainan (TW); Chaoyen Huang, Hsinchu (TW); Yi Chuan Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 209 days.

(21) Appl. No.: 17/460,064

(22) Filed: Aug. 27, 2021

(65) Prior Publication Data

US 2023/0069127 A1 Mar. 2, 2023

(51) Int. Cl.

| | |
|---|---|
| ***B67D 7/34*** | (2010.01) |
| ***B65B 57/02*** | (2006.01) |
| ***B67C 3/26*** | (2006.01) |
| ***B67D 7/02*** | (2010.01) |
| ***H01L 21/67*** | (2006.01) |

(52) U.S. Cl.
CPC .......... *H01L 21/6715* (2013.01); *B65B 57/02* (2013.01); *B67C 3/2637* (2013.01); *B67D 7/0272* (2013.01); *B67D 7/0288* (2013.01); *B67D 7/348* (2013.01)

(58) Field of Classification Search
CPC ... H01L 21/6715; B65B 57/02; B67C 3/2637; B67D 7/0272; B67D 7/0288; B67D 7/348
See application file for complete search history.

(56) References Cited

U.S. PATENT DOCUMENTS

| | | | | |
|---|---|---|---|---|
| 5,875,921 A * | 3/1999 | Osgar | G01F 13/006 | 222/105 |
| 6,206,240 B1 * | 3/2001 | Osgar | B67D 7/3263 | 222/64 |
| 6,271,753 B1 * | 8/2001 | Shukla | B65D 55/028 | 340/571 |
| 6,843,414 B2 * | 1/2005 | Madrid | B65D 1/12 | 235/383 |
| 7,152,781 B2 * | 12/2006 | O'Dougherty | G05B 19/0425 | 235/375 |

(Continued)

FOREIGN PATENT DOCUMENTS

| | | |
|---|---|---|
| CN | 107863313 A | 3/2018 |
| KR | 10-20200043868 A | 4/2020 |

OTHER PUBLICATIONS

Office Action, Cited References and Search Report dated Jan. 4, 2023 issued by the Taiwan Intellectual Property Office for the Taiwan counterpart application No. 111113302.

(Continued)

*Primary Examiner* — Nicolas A Arnett
(74) *Attorney, Agent, or Firm* — WPAT LAW; Anthony King

(57) ABSTRACT

The present disclosure provides a chemical supply system, including a chamber, a tubing extending into the chamber, an interlock apparatus, including a fixture for fastening the tubing, and means for determining whether the tubing is fastened by the fixture.

20 Claims, 33 Drawing Sheets

(56) References Cited

U.S. PATENT DOCUMENTS

| | | | | |
|---|---|---|---|---|
| 7,702,418 | B2 * | 4/2010 | O'Dougherty | B67D 7/0283 73/866.5 |
| 7,760,104 | B2 * | 7/2010 | Asp | B65D 1/12 141/2 |
| 8,140,184 | B2 * | 3/2012 | Chen | G01F 11/284 700/265 |
| 8,464,499 | B2 * | 6/2013 | Asp | B67D 7/348 53/410 |
| 9,004,320 | B2 * | 4/2015 | Keating | B67D 3/0041 222/207 |
| 9,580,294 | B2 * | 2/2017 | Lewis | B67D 7/344 |
| 10,618,726 | B2 * | 4/2020 | Wahl | H04L 67/12 |
| 11,708,211 | B2 * | 7/2023 | Keating | B65D 47/248 222/54 |
| 2004/0041709 | A1 * | 3/2004 | Forster | B67D 1/0871 340/603 |
| 2005/0199700 | A1 * | 9/2005 | Baker | G06Q 10/06 257/679 |

OTHER PUBLICATIONS

Brief English translation of Office Action, Cited References and Search Report dated Jan. 4, 2023 issued by the Taiwan Intellectual Property Office for the Taiwan counterpart application No. 111113302.
English Abstract of CN107863313A.
English Abstract of KR10-20200043868A.

* cited by examiner

120C

INTERLOCK APPARATUS FOR CHEMICAL SUPPLY SYSTEM

BACKGROUND

Chemical supply system is widely used in manufacturing industry. For example, semiconductor fabrication, cleaning, photolithography, planarization, etching, and other process often requires chemical supply in order to perform certain operations. In order to supply chemicals in an efficient fashion, chemicals are often stored in fabrication lab (FAB), sub-FAB, or chemical storage room in factory.

In order to enhance the throughput of manufacturing, it is often required to store certain amount of chemicals at designated places. Various types of containers are utilized as chemical storage, for example, drum pumps, chemical bottles, barrels, pumps, tanks, chemical packages, or the like. Some of the containers would need to be replaced after the chemical stored therein are empty or substantially empty.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
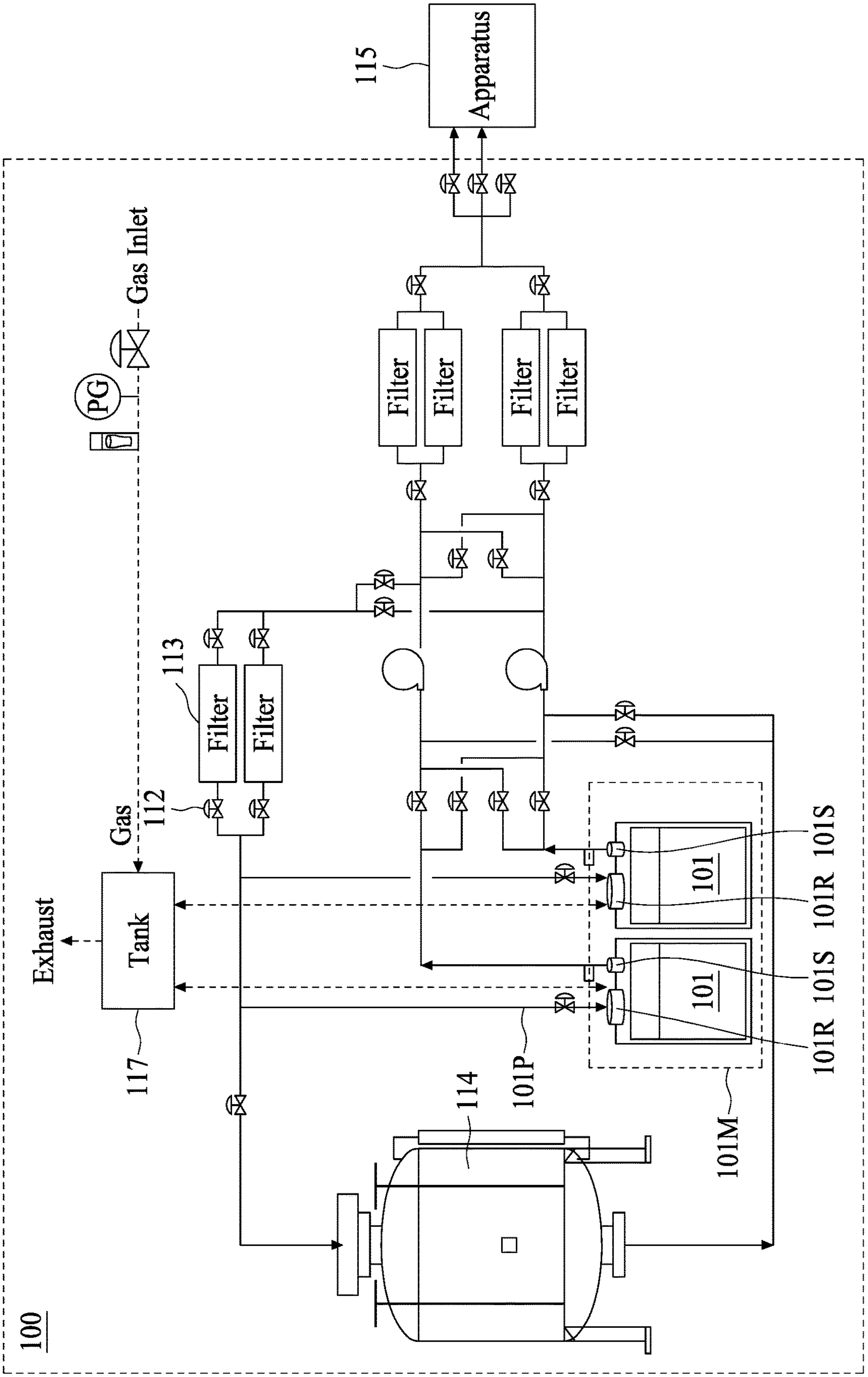
FIG. 1A is a schematic pipeline diagram of a chemical supply system, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Various types of chemical may be utilized during the operations of fabricating semiconductor devices. In some cases, the chemicals may be stored in supply apparatus, such as drum pumps, chemical bottles, barrels, pumps, tanks, chemical package, or the like. Some of the containers would need to be replaced after the chemical stored therein are empty or substantially empty. However, such replacement are often executed manually, wherein human error occurs from time to time. In the case of exchanging drum pumps or other types of supply apparatus, when replacement operations are not properly done, chemical leakage may occur and causes injury or contamination. One of the practical issues is that operators often forgets to reconnect each of connectors of tubing back to supply apparatus before executing chemical supply instruction to the supply system.

The present disclosure provides an interlock system that may decrease human errors. The foolproof system may help confirming whether the replacement operations are properly done and preventing chemical leakage if human errors occurred. The present disclosure incorporates hardware interlock with software interlock to further improve the effect of foolproof interlock.

Referring to FIG. 1A, FIG. 1A is a schematic pipeline diagram of a chemical supply system, according to some embodiments of the present disclosure. A chemical supply system 100 may include a chemical supply chamber 101M (which includes one or more chemical container 101), tubing 101P connecting between the chemical container 101 and an apparatus 115 of a factory, laboratory or fabrication lab. In some embodiments, the chemical supply system 100 may further include valves 112 and/or filters 113 connected to tubing 101P to control the flow of chemicals or decrease contaminants therein. In some embodiments, the chemical supply system 100 may further includes temporary storage 114 for storing chemical 199 (shown in FIG. 1C).

Figure 1B:
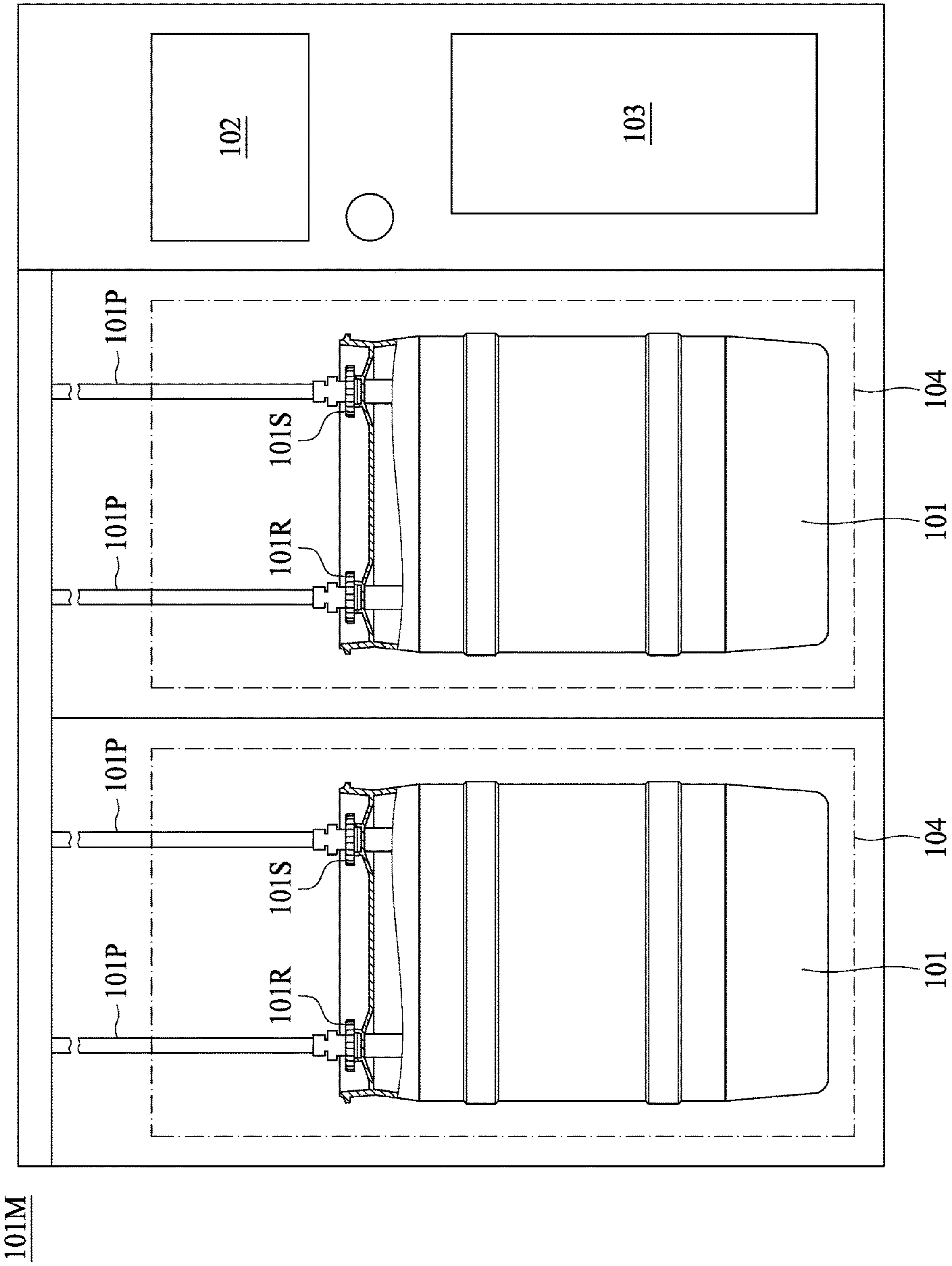
FIG. 1B is a schematic drawing illustrating a chemical supply chamber, according to some embodiments of the present disclosure.
Figure 1C:
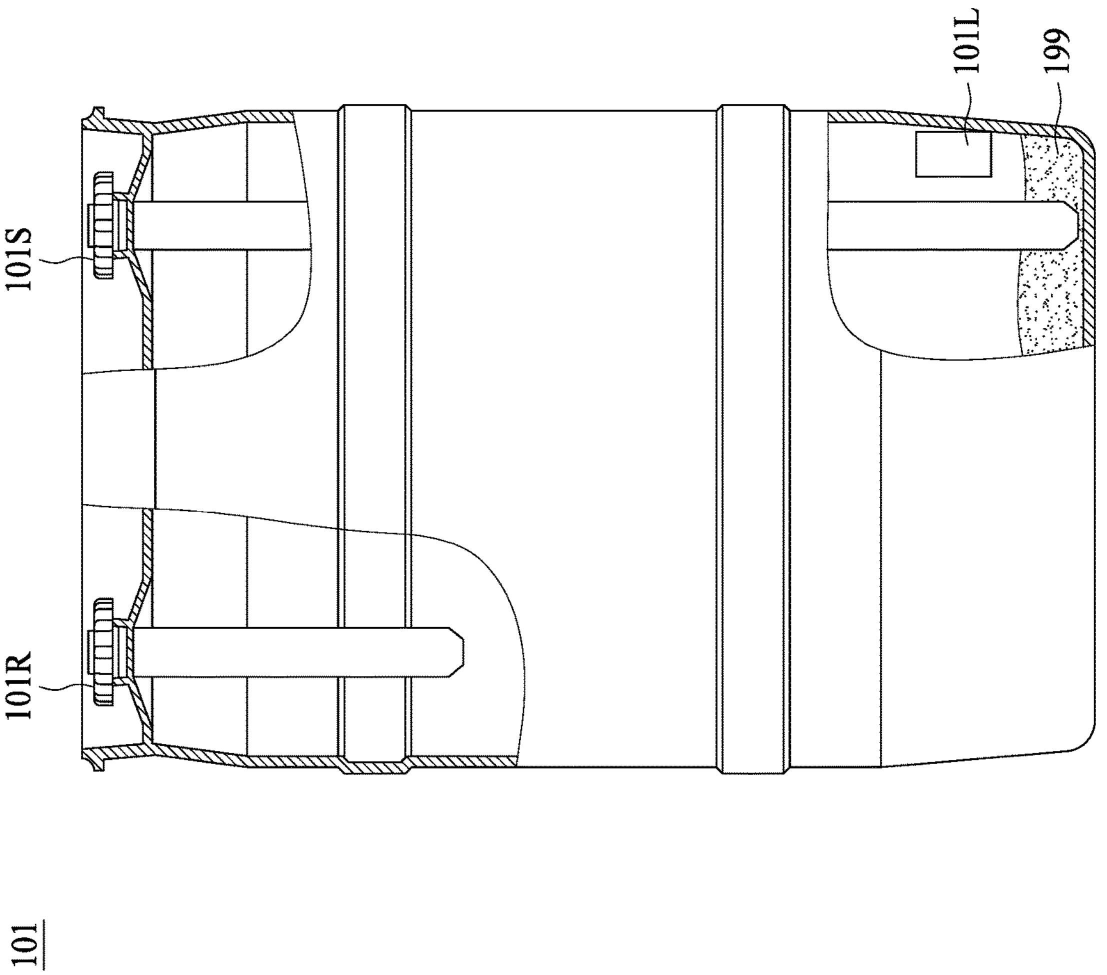
FIG. 1C shows a partial cross sectional view of a chemical supply container, according to some embodiments of the present disclosure.

Referring to FIG. 1A, FIG. 1B and FIG. 1C, FIG. 1B is a schematic drawing illustrating a chemical supply chamber, FIG. 1C shows a partial cross sectional view of a chemical supply container, in accordance with some embodiments of the present disclosure. A chemical supply chamber 101M may be placed inside or outside of a factory, laboratory or fabrication lab. Particularly in semiconductor industry, the chemical supply chamber 101M may be referred to a chemical supply cabinet, a chemical dispense unit (CDU), a space/room in cleaning room, a space/room in sub-fab, drum pump cabinet, a chamber, or the like. In some embodiments, the chemical supply chamber 101M may have an entrance 104 that allows an operator to access the chemical supply chamber 101M in some cases. One or more chemical container(s) 101 is disposed in the chemical supply chamber 101M, wherein the chemical containers 101 may be, but not limited to, drum pumps, chemical bottles, barrels, pumps, tanks, chemical package, or the like. In FIG. 1A to FIG. 5F, drum pumps are shown in the drawings as examples, but the present disclosure is also applicable to other types of chemical containers.

In some embodiments, the chemical containers 101 may include a suction port 101S and a return port 101R apart from the suction port 101S. A suction port 101S allows tubing 101P to extract chemical 199 from the chemical containers 101, and the return port 101R allows the chemical containers 101 to receive chemical 199 from another tubing 101P. In some embodiments, the chemical containers 101 may include a plurality of chambers, where the suction port 101S and return port 101R are respectively connected to different chambers.

In some embodiments, the chemical supply chamber 101M further includes operation interface 102 and/or controller 103. Operators may input instruction to controller 103 via operation interface 102, or, the operation interface 102 may display various parameters or conditions of the chemical supply system 100. In some embodiments, the operation interface 102 and the controller 103 may be adjacent to the chemical containers 101. However, in some alternative embodiments, the operation interface 102 and/or the controller 103 may also be portable or disposed at a position distal to the chemical containers 101 to enable remote control.

In some of the embodiments, the chemical supply system 100 may further include tank 117, wherein the tank 117 is connected to gas supply and may include tank blanketing regulator. In some embodiments, the tank 117 is utilized to store gas that does not react with chemical 199 stored in the chemical containers 101, such as $N_2$ or other inert gas. Gas is supplied through a gas inlet and stored into the tank 117. The tank 117 may be maintained at a predetermined pressure, for example, at a slightly positive pressure. The tank 117 may further include an exhaust exit that can exhaust the gas from the tank 117. The tank 117 can be utilized to pump gas into the chemical containers 101 for certain purposes, such as exhausting or pumping the chemical 199 in the chemical containers 101.

The controller 103 may communicate with the interface 102, interlock apparatus (which would be discussed in FIG. 1D to FIG. 5F) or sensors that determines the condition of entrance 104, valves 112, filters 113, certain positions at tubing 101P, chemical containers 101, the chemical supply chamber 101M or the tank 117 (or the tank blanketing regulator/inlet disposed thereon). The controller 103 can be implemented by software such that the methods disclosed in the present disclosure can be automatically or semi-automatically performed, or serve as assistance to manual operation. For a given computer, the software routines can be stored on a storage device, such as a permanent memory. Alternately, the software routines can be machine executable instructions stored using any machine readable storage medium, such as a diskette, CD-ROM, magnetic tape, digital video or versatile disk (DVD), laser disk, ROM, flash memory, etc. The series of instructions could be received from a remote storage device, such as a server on a network. The present invention can also be implemented in hardware systems, microcontroller unit (MCU) modules, discrete hardware or firmware.

Figure 1D:
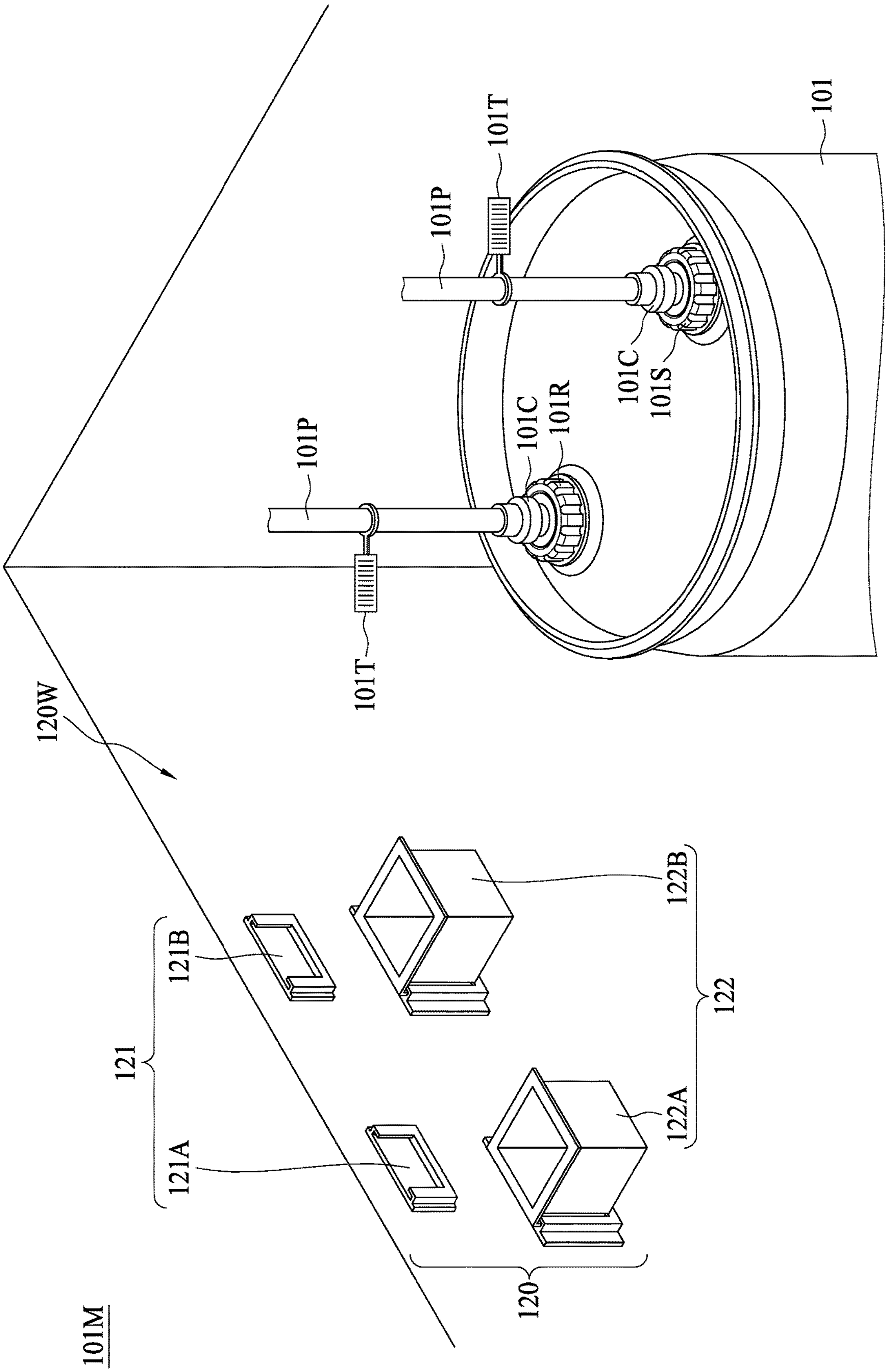
FIG. 1D is a schematic drawing illustrating a chemical supply chamber and a chemical supply container, according to some embodiments of the present disclosure.

Referring to FIG. 1D, FIG. 1D is a schematic drawing illustrating the chemical supply chamber 101M previously shown in FIG. 1A, in accordance with some embodiments of the present disclosure. FIG. 1D shows one chemical containers 101 in the chemical supply chamber 101M. The tubing 101P are connected to the suction port 101S and the return port 101R through connectors 101C. In some embodiments, the connectors 101C may include a cap or a threaded cap that has an inner thread, which allows the tubing 101P to be fastened over the suction port 101S and the return port 101R. In some cases, the suction port 101S and the return port 101R as threaded portion that corresponds to the inner thread of the connectors 101C. However, the present disclosure is not limited to threaded-fixing mechanism. For example, the tubing 101P can be fastened to the suction port 101S and the return port 101R through other types of corresponding fixing elements (such as one piece inserted into another piece, one piece clipping with another piece, or the like).

The chemical supply chamber 101M includes one or more inner sidewall(s) 120W. In some of the embodiments, an operator can access to the inner sidewall(s) 120W through entrance 104 (shown in FIG. 1B) from outside. In such case, operator can remove the used chemical container 101 through the entrance from the chemical supply chamber 101M and transfer a next chemical container 101 through the entrance 104 into the chemical supply chamber 101M. In the present disclosure, the "next" chemical container 101 may be referred to a new chemical container 101 different from a used chemical container 101, or, a second chemical container 101 different from a first chemical container 101 previously being utilize to supply chemical.

The chemical supply system 100 further includes an interlock apparatus 120 proximal to the position for placing chemical container 101. In some embodiments, the interlock apparatus 120 is disposed on the inner sidewall 120W of the chemical supply chamber 101M. However, in some alternative embodiments, the interlock apparatus 120 can also be disposed in other suitable places in the chemical supply chamber 101M, such as the entrance 104, a floor, a ceiling, or an outer sidewall of the chemical supply chamber 101M. In some other alternative embodiments, the interlock apparatus 120 can also be disposed on a supporting structure or movable structure in or outside of the chemical supply chamber 101M.

The details of interlock apparatus 120 are subsequently discussed in FIG. 2A to FIG. 5F, wherein FIG. 3A to FIG. 3F discuss an approach of incorporating optical sensors into an interlock apparatus (hereinafter denoted as 120A), FIG. 4A to FIG. 4F discuss an approach of incorporating proximity sensor into an interlock apparatus (hereinafter denoted as 120B), and FIG. 5A to FIG. 5F discuss an approach of incorporating electrical switch (such as reed switch, electromagnetic switch, piezoelectric sensor, or the like) and a determination circuit into an interlock apparatus (hereinafter denoted as 120C). Details of alternative embodiments of interlock apparatus 120A' and 120B' would be subsequently discussed in FIG. 6A to FIG. 8C, wherein FIG. 7A to FIG. 7C discusses an alternative approach of incorporating optical sensors into an interlock apparatus (hereinafter denoted as 120A') and FIG. 8A to FIG. 8C discusses an alternative approach of incorporating proximity sensor into an interlock apparatus (hereinafter denoted as 120B'). Method of replacement operation for chemical container 101 by utilizing interlock apparatus 120A, 120B, 120C, 120A' or 120B' are discussed in FIG. 2A to FIG. 2C.

Figure 2A:
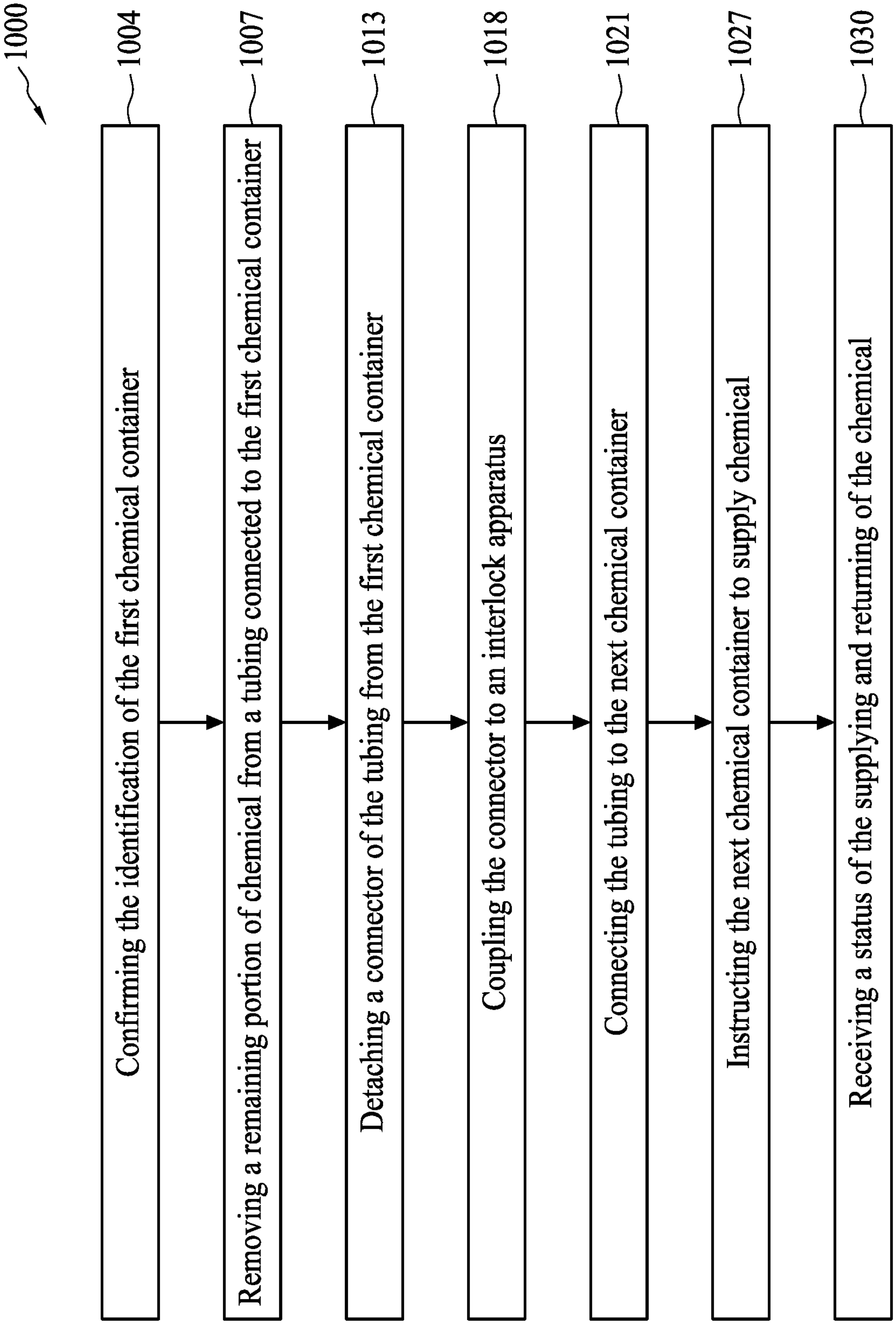
FIG. 2A shows a flow chart representing a method for exchanging chemical supply container, in accordance with some embodiments of the present disclosure.

Referring to FIG. 2A, FIG. 2A shows a flow chart representing a method for exchanging chemical supply container, in accordance with some embodiments of the present disclosure. The method 1000 for exchanging chemical supply container includes confirming the identification of the first chemical container (operation 1004), removing a remaining portion of chemical from tubing connected to the first chemical container (operation 1007), detaching the connector from the first chemical container (operation 1013), coupling the connector to an interlock apparatus (operation 1018, which can be referred to FIG. 3E, FIG. 4E, FIG. 5E, FIG. 7B, or FIG. 8B), connecting the tubing to the next chemical container and confirming the identification of the next chemical container (operation 1021, which can be referred to FIG. 3D, FIG. 4D, FIG. 5D, FIG. 7A, or FIG. 8A), instructing the next chemical container to supply chemical (operation 1027), and receiving a status of the supplying and returning of the chemical (operation 1030).

Referring to FIG. 1A to FIG. 1D and FIG. 2A, the chemical container 101 may further includes a sensor 101L for detecting the remaining amount of chemical 199. When the chemical container 101 in use is empty or the remaining amount of chemical 199 is less than a predetermined amount, the sensor 101L may transmit an empty signal to the controller 103. After the controller 103 receives the empty signal, the operator may be notified and can prepare for replacing the used chemical container 101 with a next chemical container 101.

In operation 1004, the operator confirms the identification of the used chemical container 101 and the location thereof to ensure that the correct chemical container 101 is to be replaced. In some embodiments, a detectable feature 101T (such as bar code, QR code, marking or serial numbers) are determined by scanner, and a preliminary signal is generated. The detectable feature 101T may be attached to the tubing 101P or the used chemical container 101. By comparing the preliminary signal and the empty signal, the identification of the used chemical container 101 can be confirmed. An initial instruction of chemical container replacement can be transmitted to the controller 103 (for example, through the operation interface 102) to initialize the replacement operation.

In operation 1007, at least a portion of the chemical 199 in the tubing 101P connected to the used chemical container 101 (such as the ones connected to the suction port 101S and the return port 101R) is removed by draining or purging, for example, by using the gas pressurizing or using a pump. Thereby, chemical leakage during replacement may be decreased. However, although the chemical draining or purging operations can remove a portion of chemical 199 in the tubing 101P, in many cases there are still a portion of chemical 199 still temporarily remains in the tubing 101P.

In operation 1013, the tubing 101P are detached from the used chemical container 101. For example, the tubing 101P are disconnected from the suction port 101S and/or the return port 101R. In some embodiments, the detachment operation includes slightly loosening the connectors 101C to further allowing a portion of remaining chemical 199 to flow into the used chemical container 101, and then completely loosening the connectors 101C to entirely detach the tubing 101P.

Figure 3A:
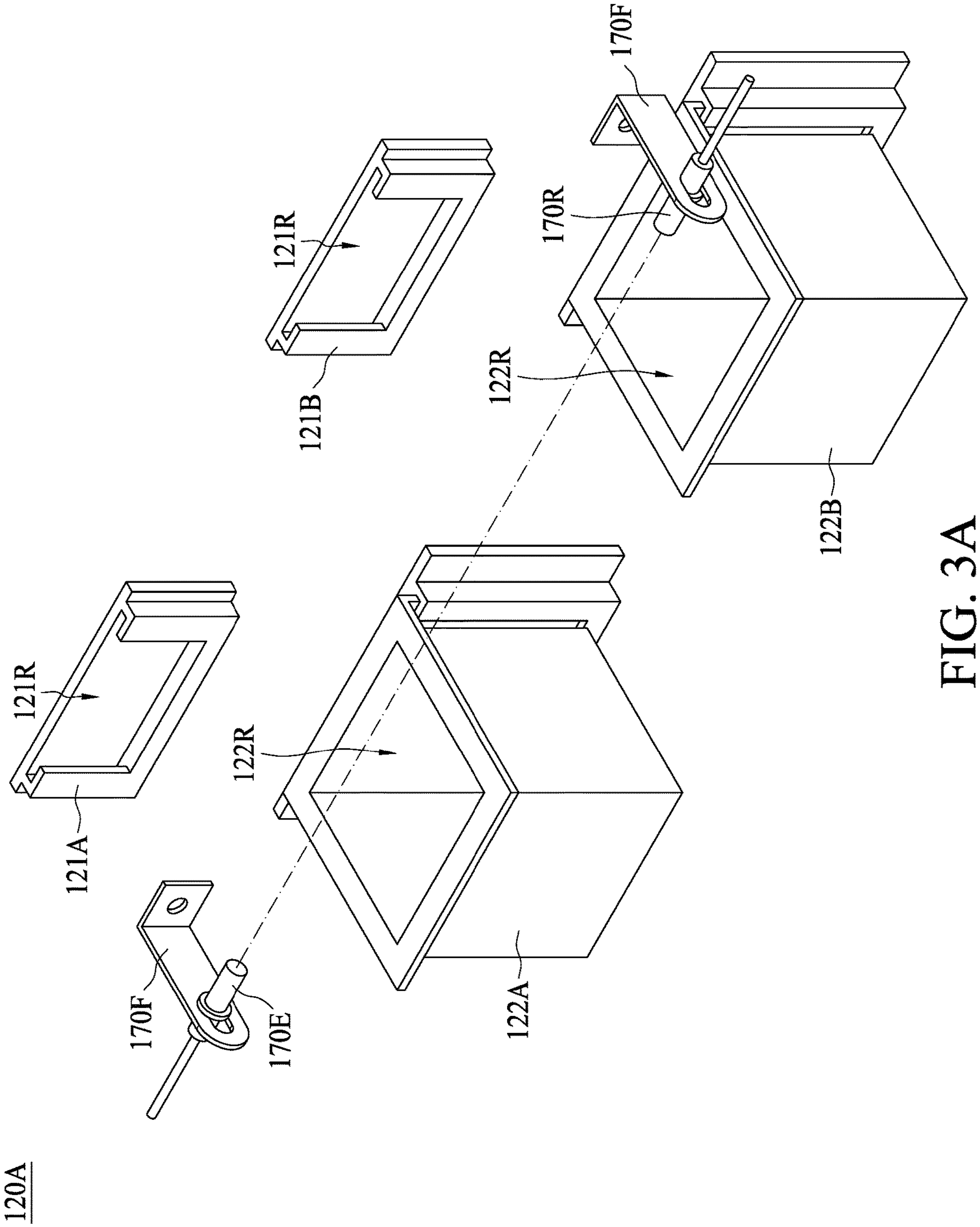
FIG. 3A is a perspective view showing an interlock apparatus for chemical supply system, in accordance with some embodiments of the present disclosure.
Figure 3B:
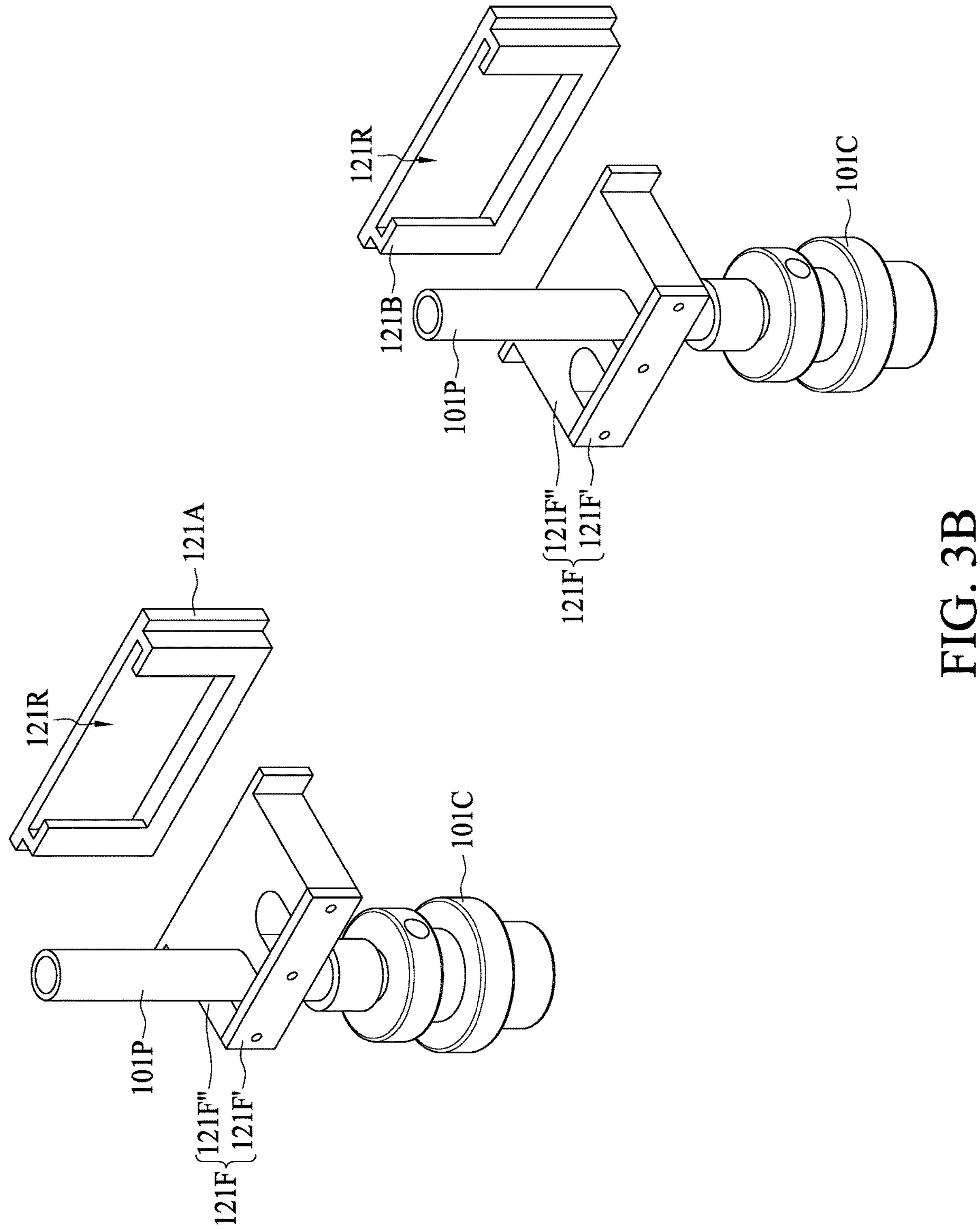
FIG. 3B is a schematic drawing illustrating a connector and an auxiliary fixture, in accordance with some embodiments of the present disclosure.
Figure 3C:
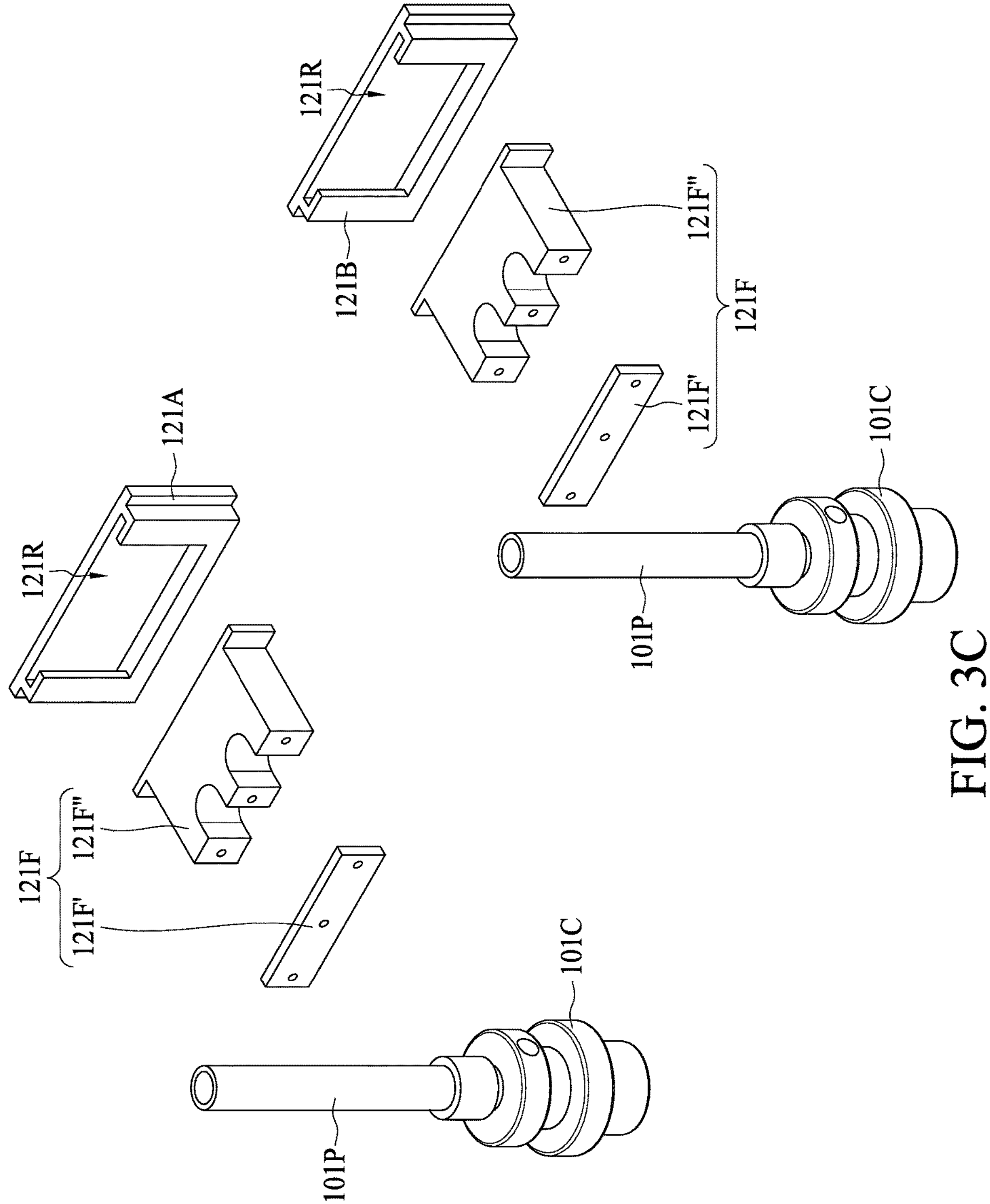
FIG. 3C is an exploded drawing illustrating a connector, a fixture, and an auxiliary fixture, in accordance with some embodiments of the present disclosure.
Figure 3D:
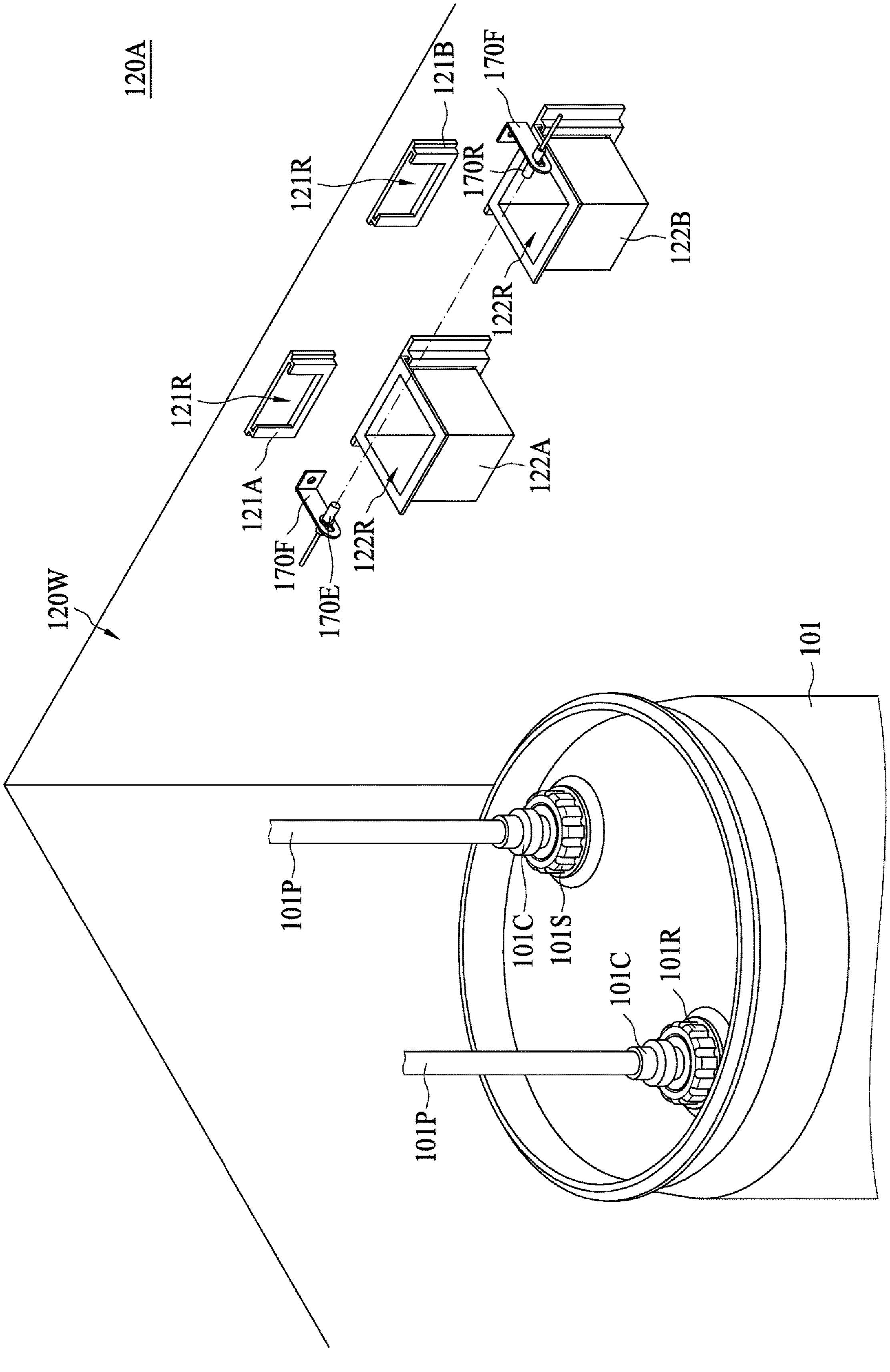
FIG. 3D is a perspective view showing an interlock apparatus under a first status, in accordance with some embodiments of the present disclosure.
Figure 3E:
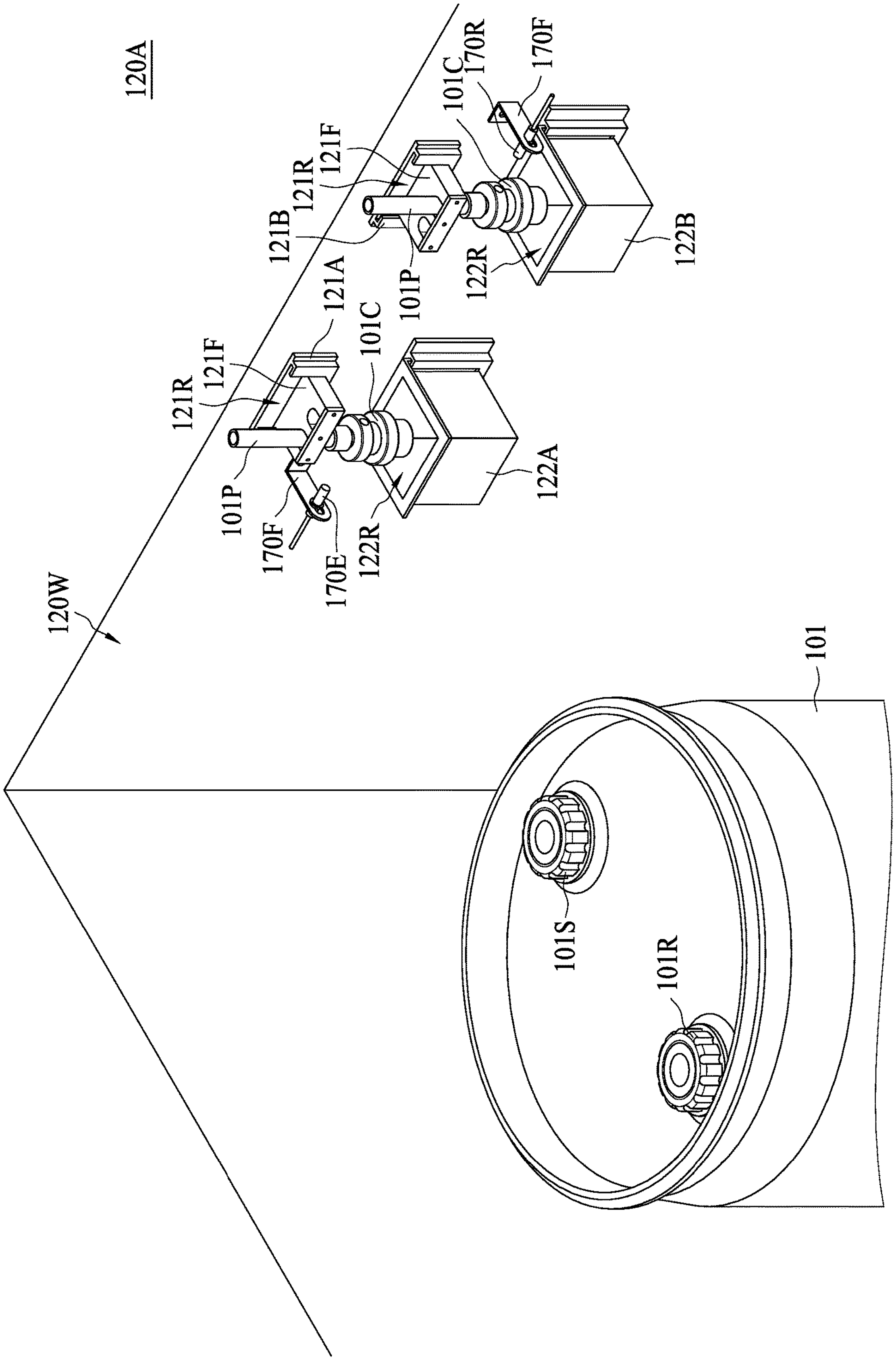
FIG. 3E is a perspective view showing an interlock apparatus under a second status, in accordance with some embodiments of the present disclosure.
Figure 3F:
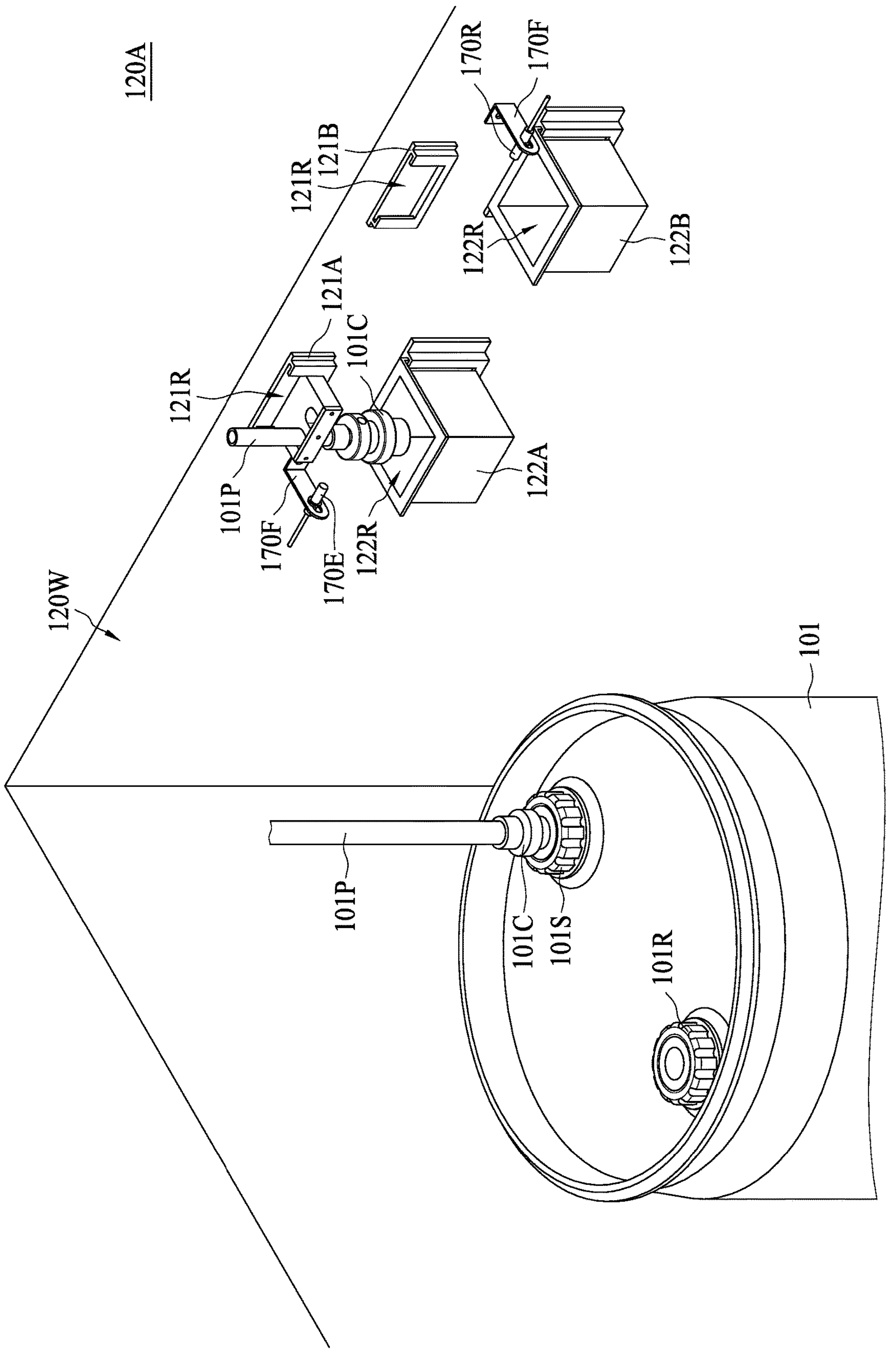
FIG. 3F is a perspective view showing an interlock apparatus under a third status, in accordance with some embodiments of the present disclosure.
Figure 4A:
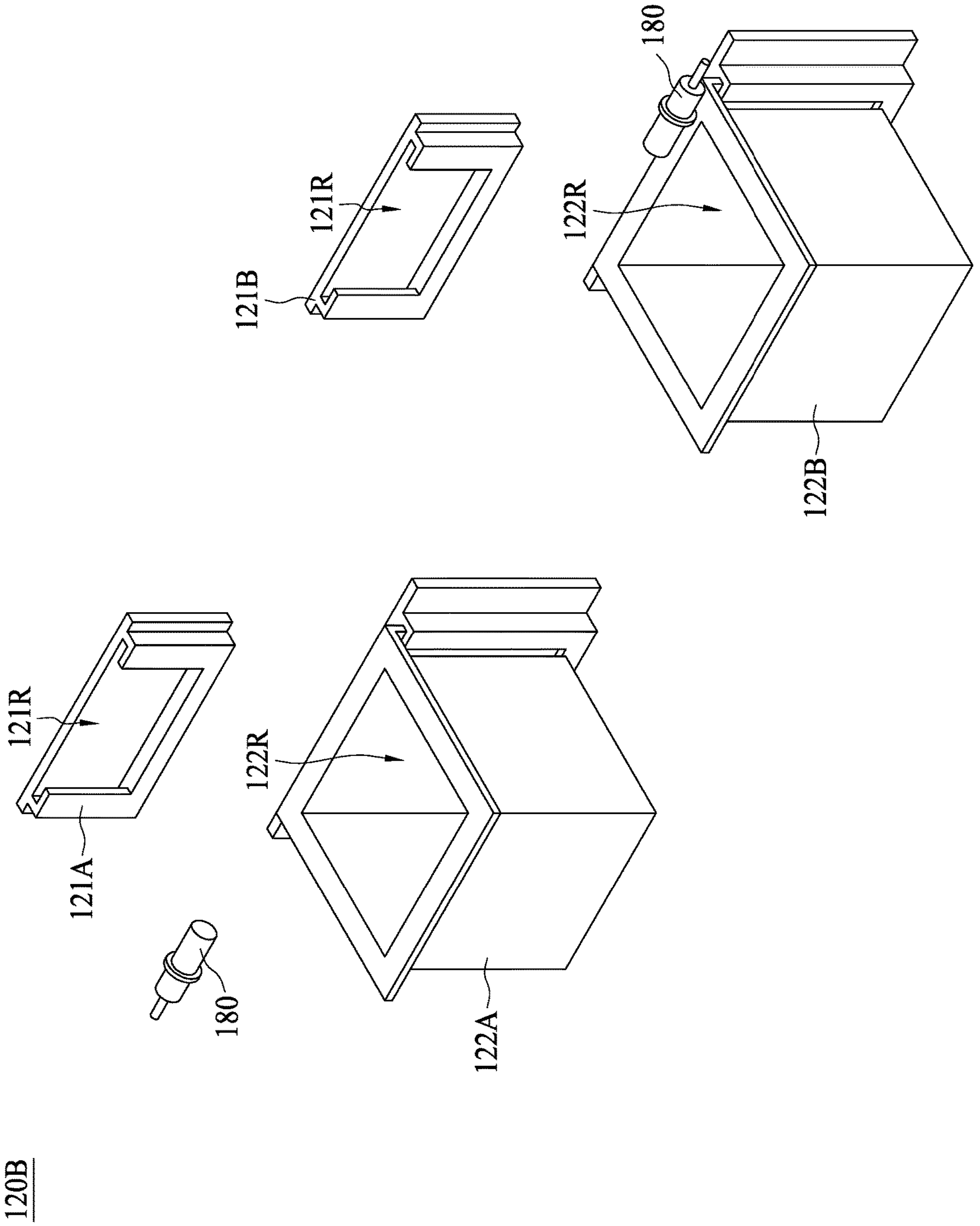
FIG. 4A is a perspective view showing an interlock apparatus and a leakage container for a chemical supply system, in accordance with some embodiments of the present disclosure.
Figure 4B:
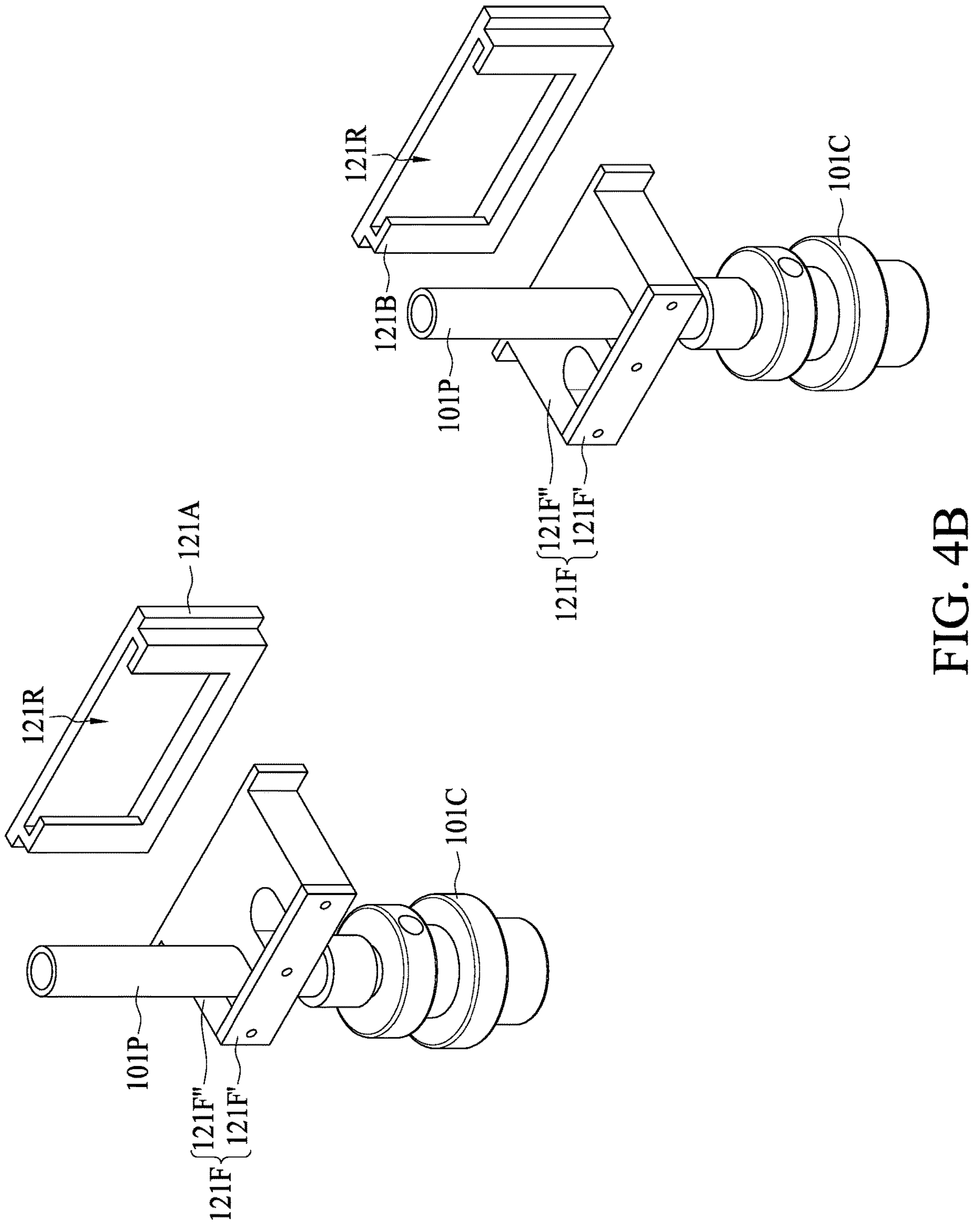
FIG. 4B is a schematic drawing illustrating a connector and an auxiliary fixture, in accordance with some embodiments of the present disclosure.
Figure 4C:
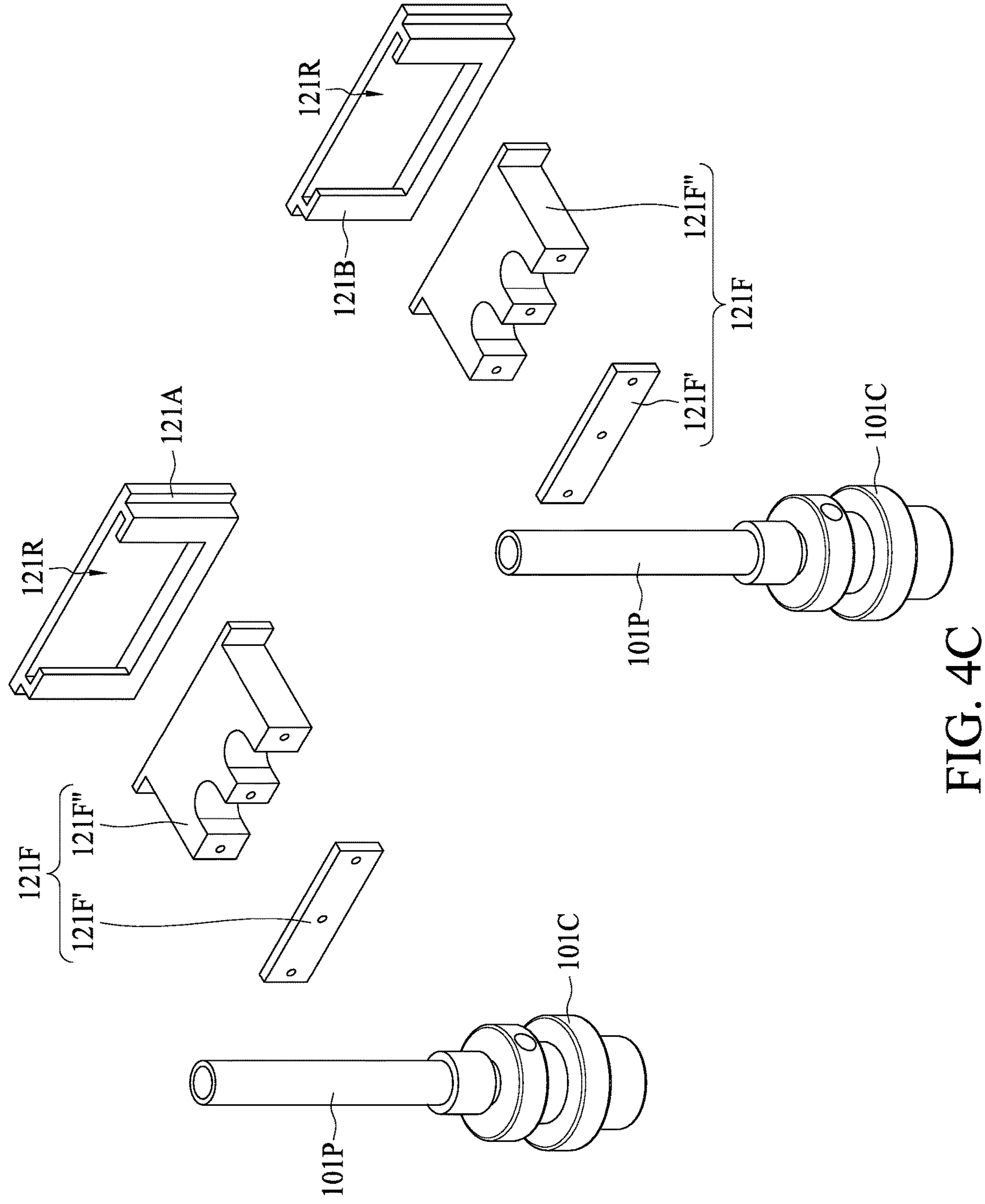
FIG. 4C is an exploded drawing illustrating a connector, a fixture and an auxiliary fixture, in accordance with some embodiments of the present disclosure.
Figure 4D:
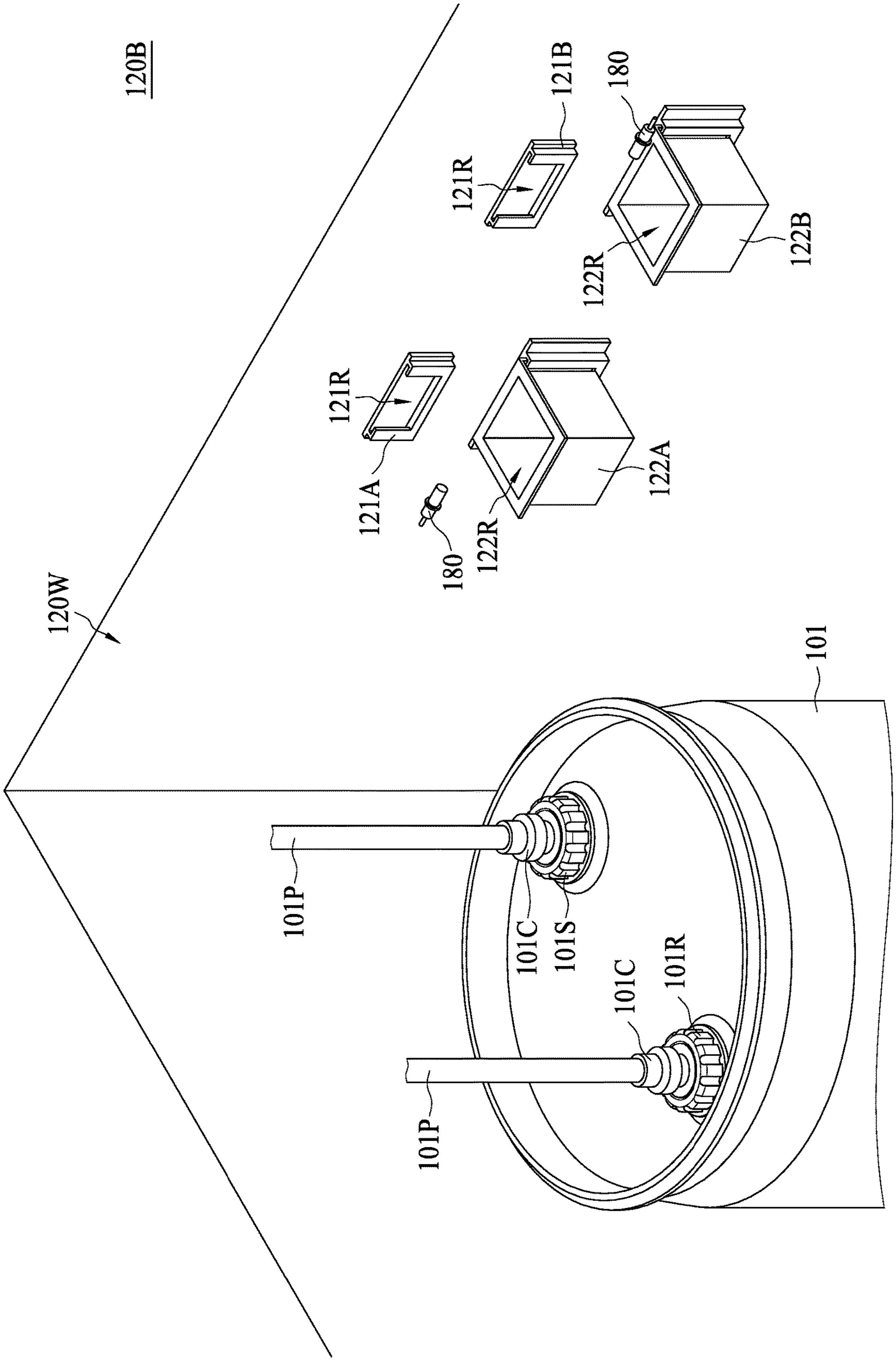
FIG. 4D is a perspective view showing an interlock apparatus under a first status, in accordance with some embodiments of the present disclosure.
Figure 4E:
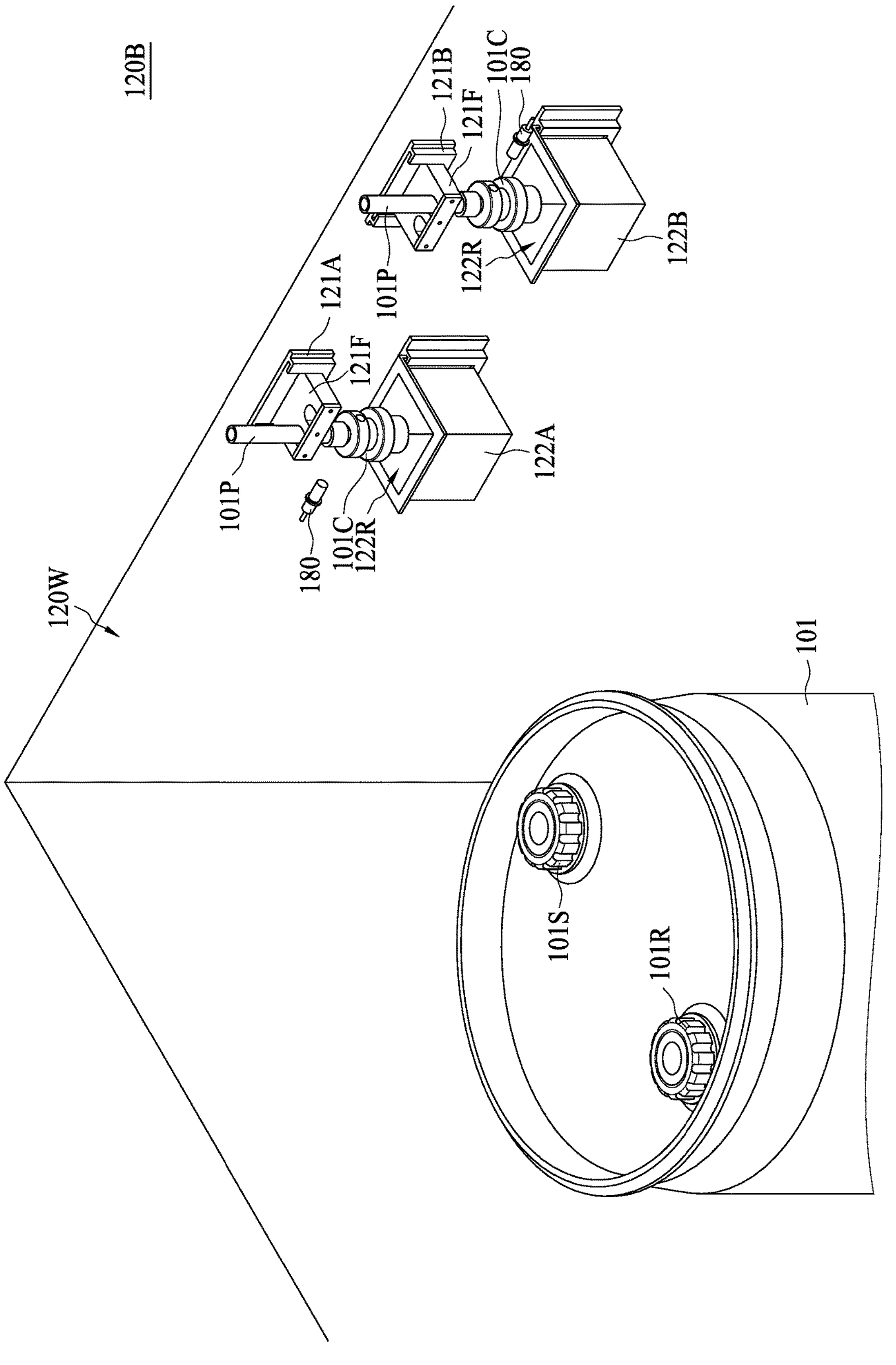
FIG. 4E is a perspective view showing an interlock apparatus under a second status, in accordance with some embodiments of the present disclosure.
Figure 4F:
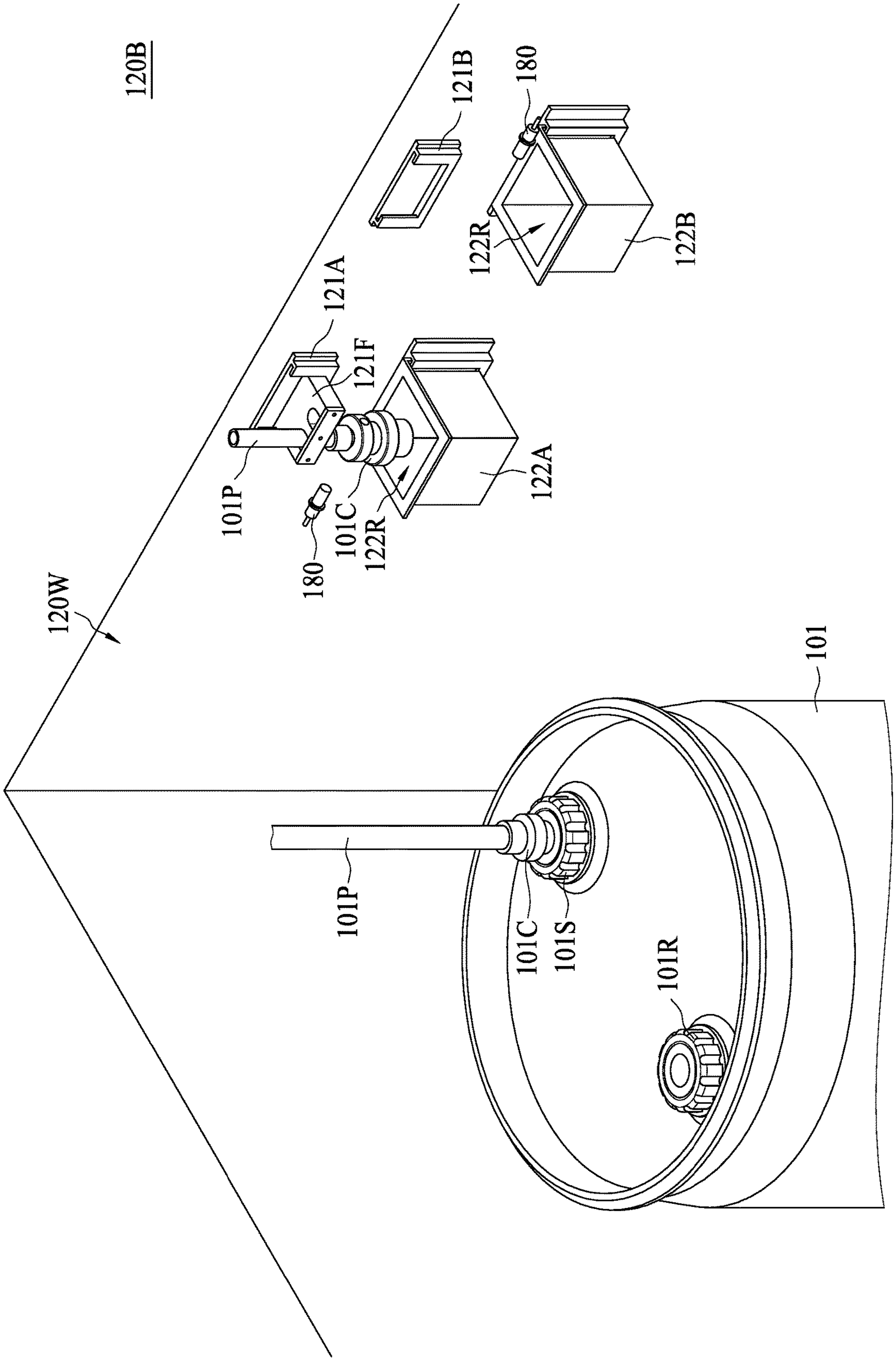
FIG. 4F is a perspective view showing an interlock apparatus under a third status, in accordance with some embodiments of the present disclosure.
Figure 5A:
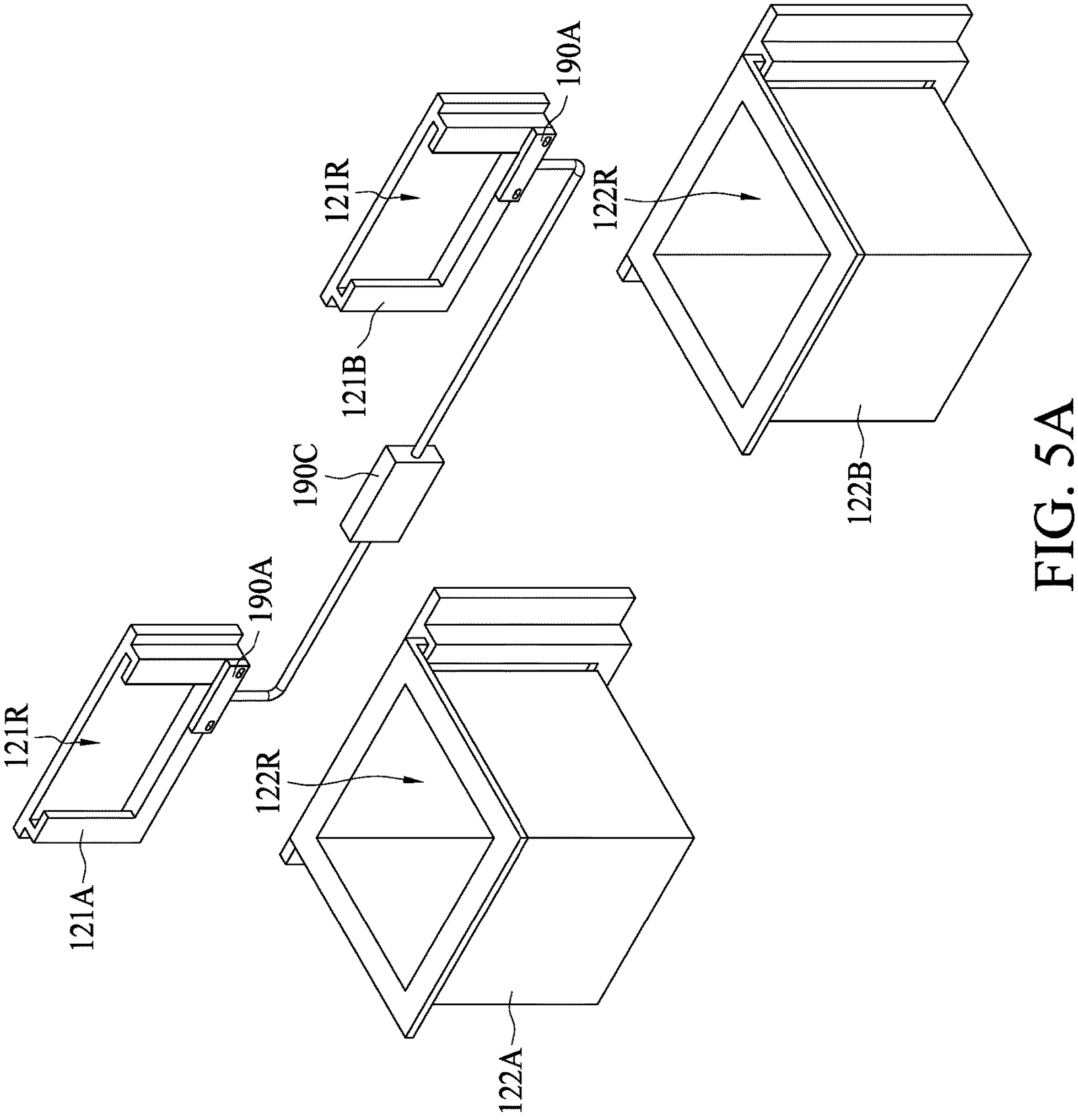
FIG. 5A is a perspective view showing an interlock apparatus and a leakage container for a chemical supply system, in accordance with some embodiments of the present disclosure.
Figure 5B:
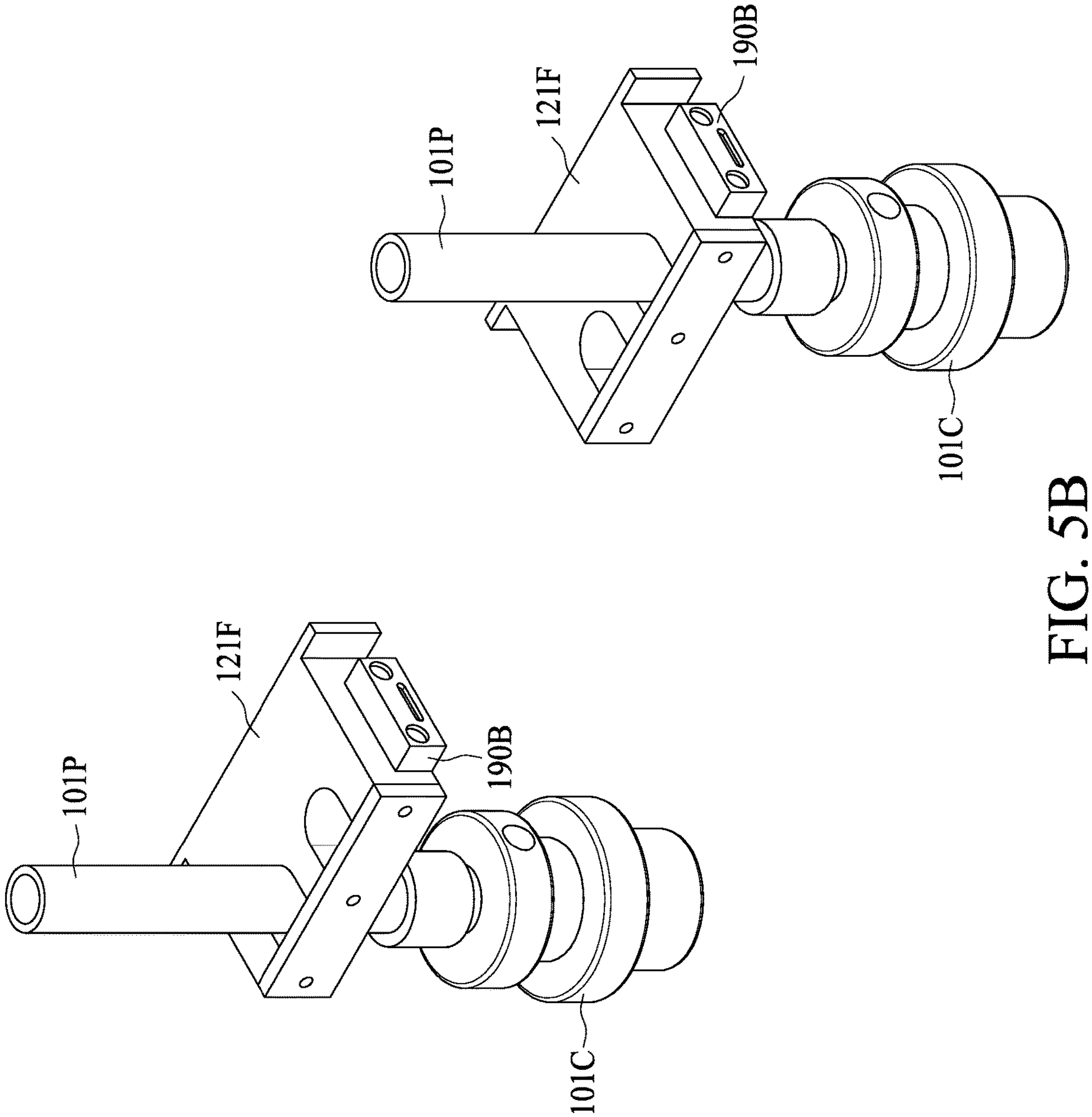
FIG. 5B is a perspective view showing a connector coupled to a tubing, in accordance with some embodiments of the present disclosure.
Figure 5C:
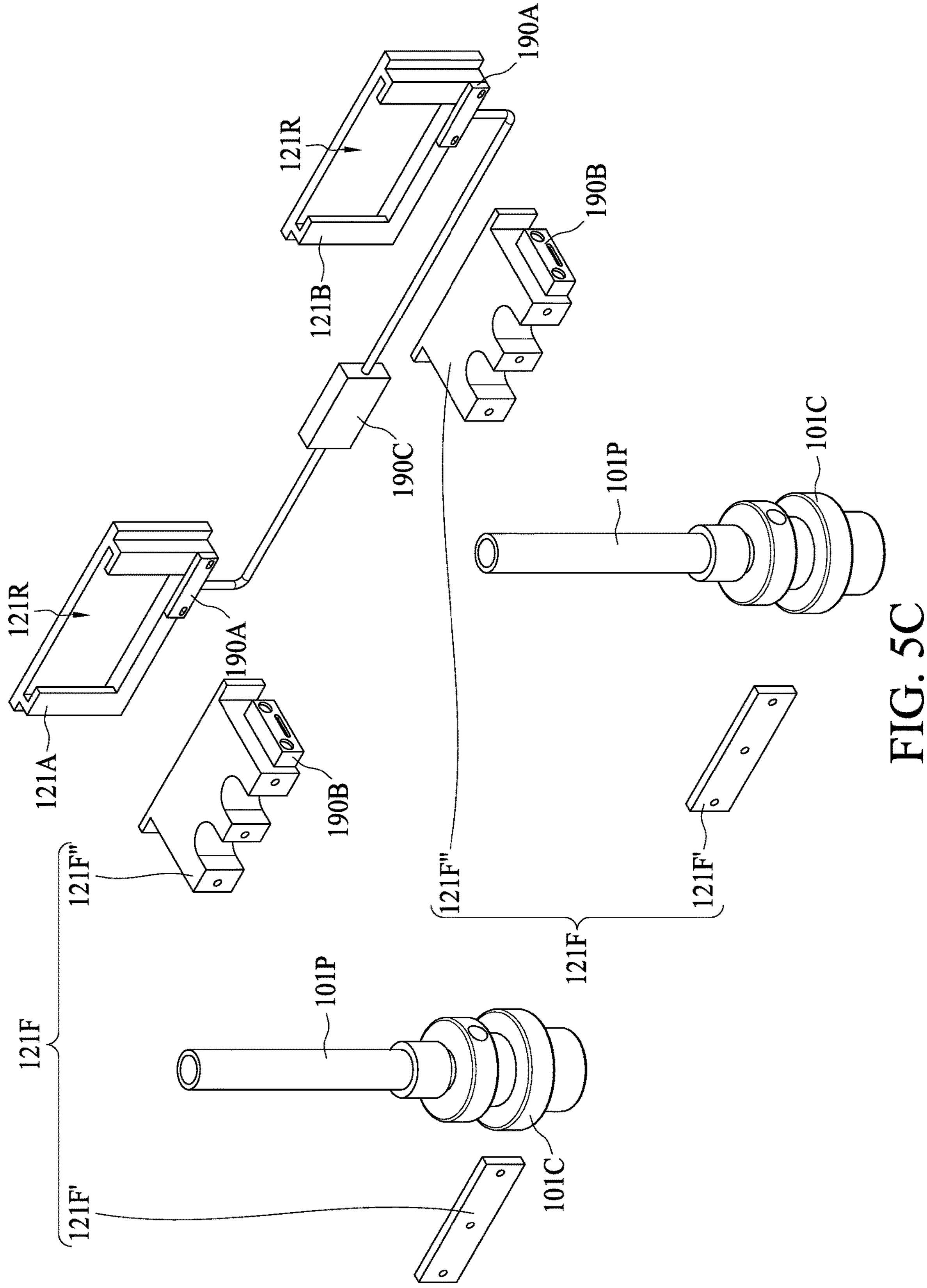
FIG. 5C is an exploded drawing illustrating a connector, a fixture, and an auxiliary fixture, in accordance with some embodiments of the present disclosure.
Figure 7A:
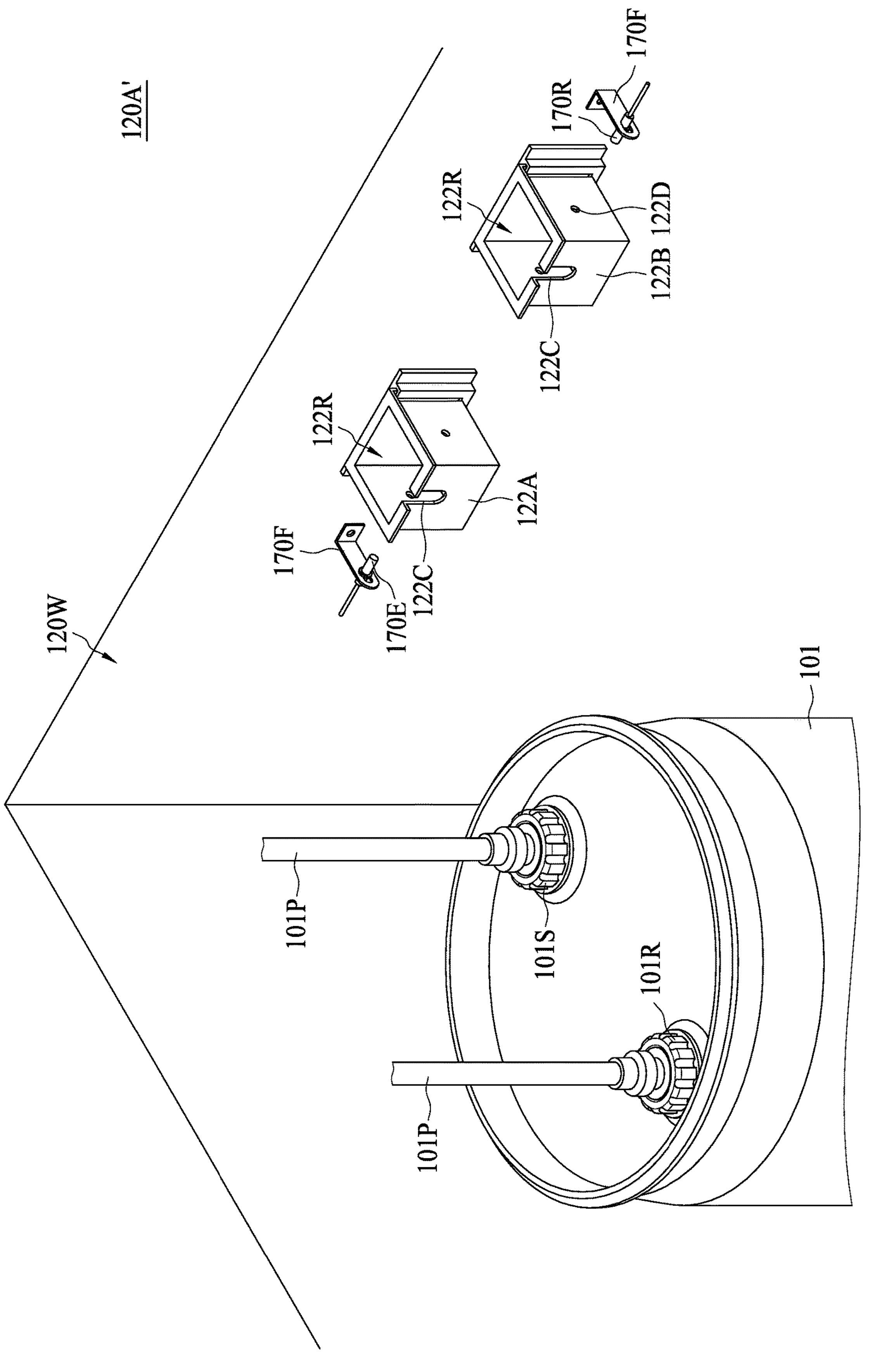
FIG. 7A is a perspective view showing an interlock apparatus under a first status, in accordance with some embodiments of the present disclosure.
Figure 7B:
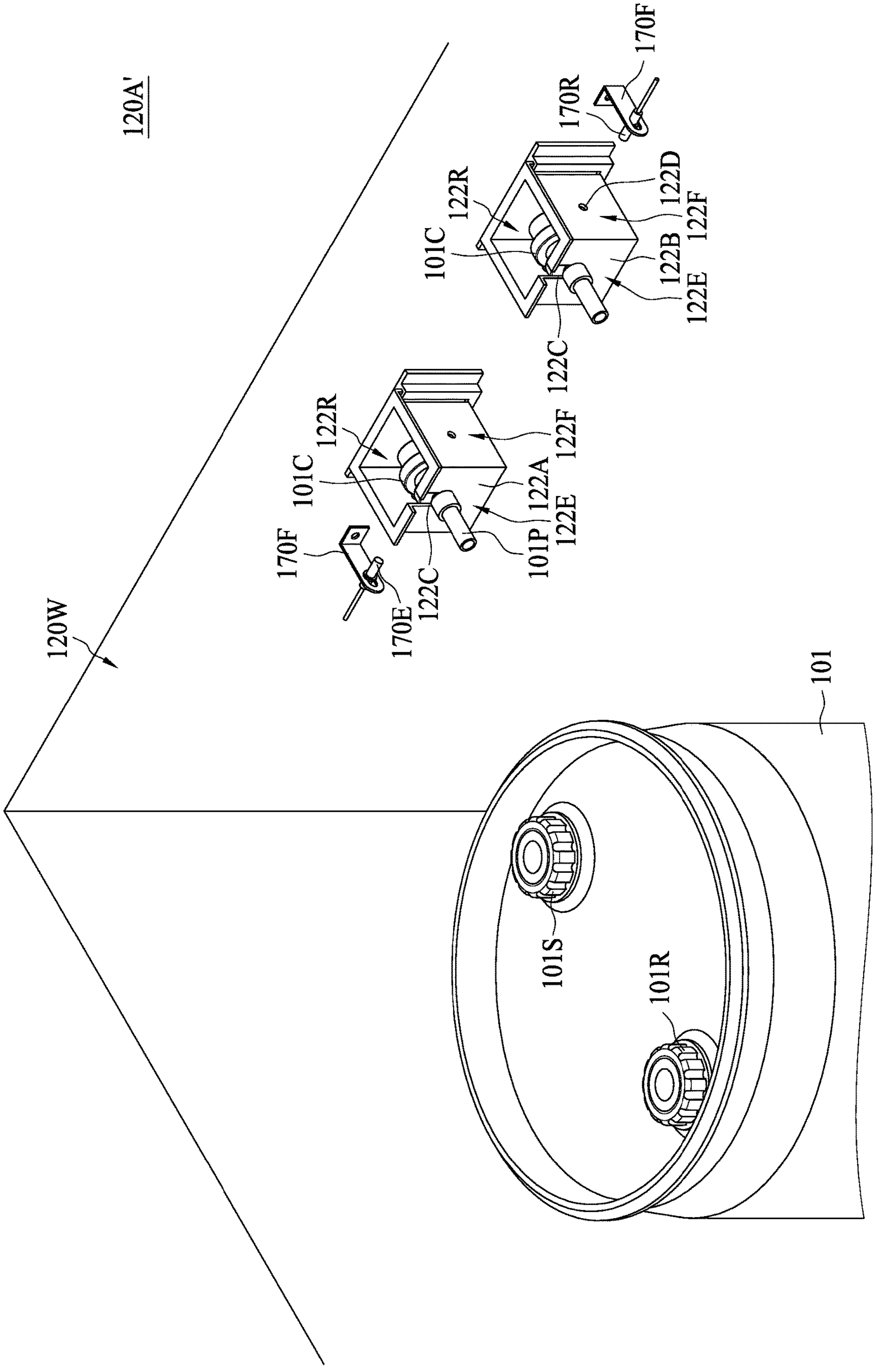
FIG. 7B is a perspective view showing an interlock apparatus under a second status, in accordance with some embodiments of the present disclosure.
Figure 7C:
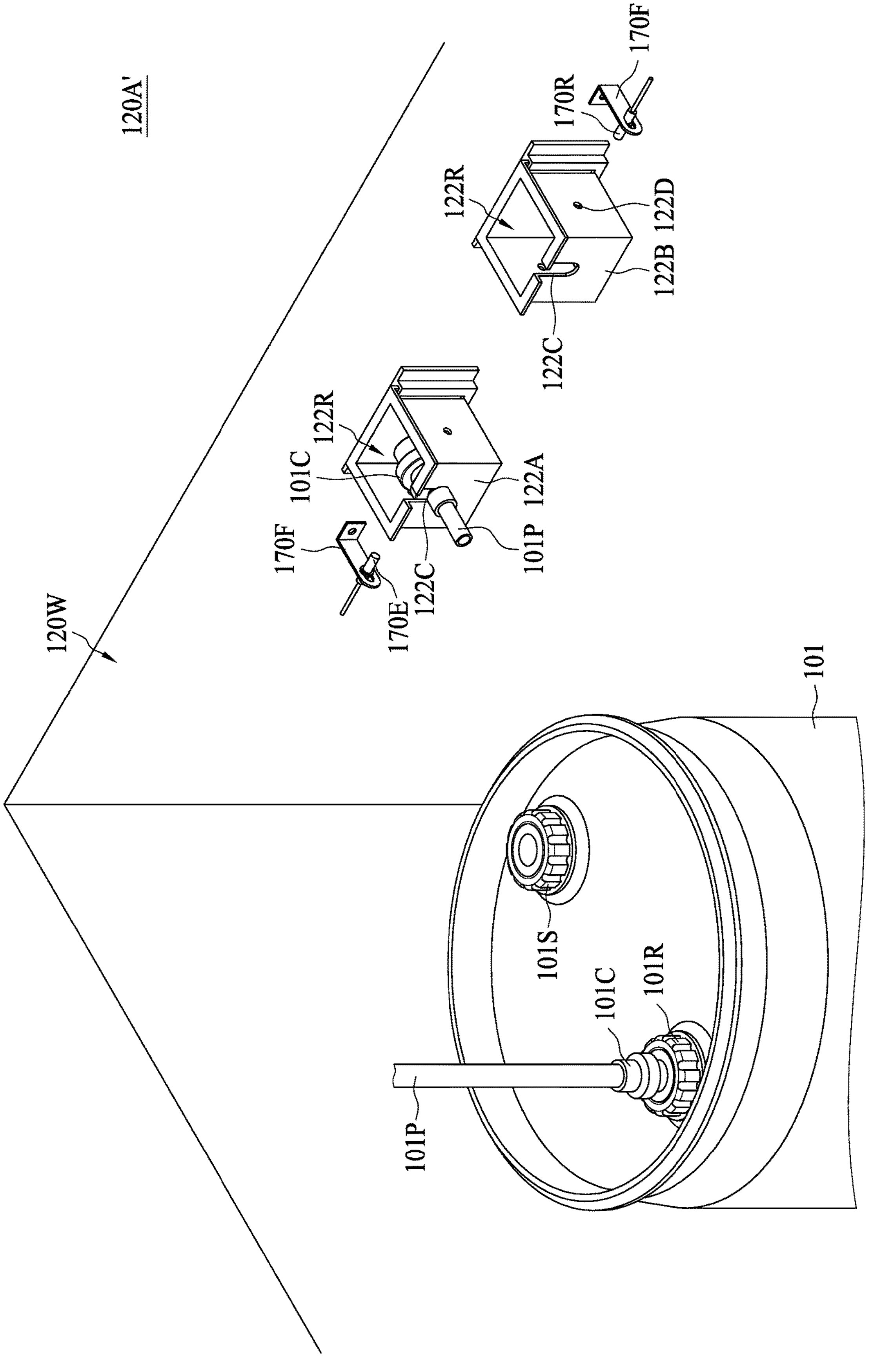
FIG. 7C is a perspective view showing an interlock apparatus under a third status, in accordance with some embodiments of the present disclosure.
Figure 8A:
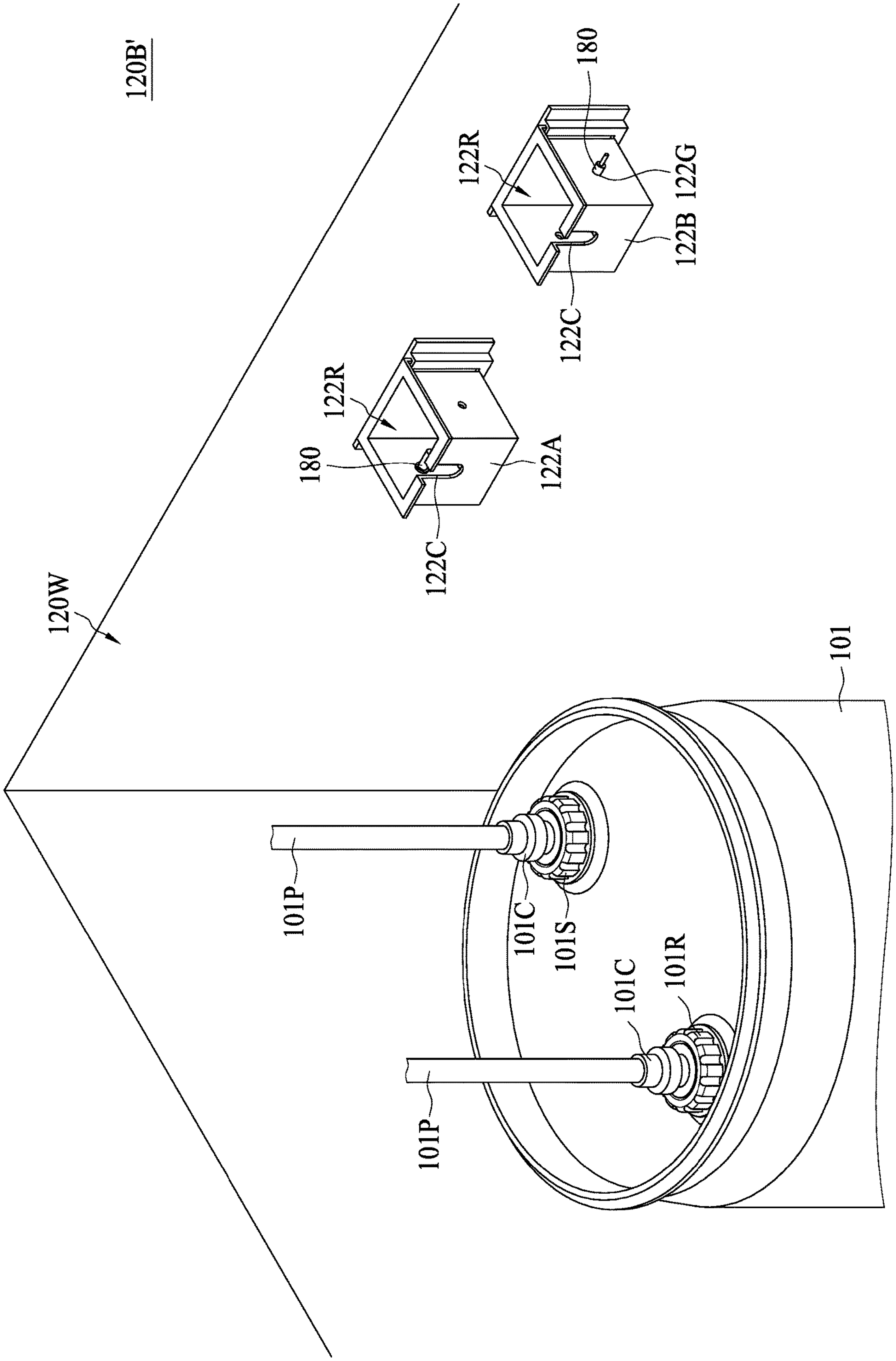
FIG. 8A is a perspective view showing an interlock apparatus under a first status, in accordance with some embodiments of the present disclosure.

In operation 1018, in order to prevent the remaining chemical 199 in the tubing 101P from leaking into the environment or spilling out, free ends of the tubing 101P are coupled to an interlock apparatus 120 (such as the interlock apparatus 120A discussed in FIG. 3A to FIG. 3F, interlock apparatus 120B discussed in FIG. 4A to FIG. 4F, interlock apparatus 120C discussed in FIG. 5A to FIG. 5F, interlock apparatus 120A' discussed in FIG. 7A to FIG. 7C, or interlock apparatus 120B' discussed in FIG. 8A to FIG. 5C). The chemical supply system 100 includes a leakage container 122 disposed on the inner sidewall 120W of the chemical supply chamber 101M for containing chemicals that drips out from the detached free ends of tubing 101P. The leakage container 122 includes a space 122R that is able to hold a certain amount of liquid. As previously discussed, an interlock apparatus 120 is proximal to the position of used chemical container 101. In some embodiments, the interlock apparatus 120 is disposed on the inner sidewall 120W of the chemical supply chamber 101M. In some embodiments, the interlock apparatus 120 includes a fixture 121 disposed above the leakage container 122 and configured to hold the detached tubing 101P. A number of the leakage container 122 and/or the fixture 121 may be in accordance to a number of the tubing 101P detached from the used chemical container 101. For example, in the case of having two tubing 101P detached from the suction port 101S and the return port 101R of the used chemical container 101, the interlock apparatus 120 may have a first leakage container 122A and a second leakage container 122B, and/or a first fixture 121A and a second fixture 121B. It is noted that in some alternative embodiments, the interlock apparatus 120 and the leakage container 122 can also be disposed in other suitable places in the chemical supply chamber 101M, such as the entrance 104, a floor, a ceiling, or an outer sidewall of the chemical supply chamber 101M. In some other alternative embodiments, the interlock apparatus 120 and the leakage container 122 can also be disposed on a supporting structure or movable structure in the chemical supply chamber 101M. In some alternative embodiments, the interlock apparatus 120 includes a fixture 122C configured on a sidewall of the leakage container 122 (instead of including separated fixture 121), wherein the fixture 122C may be utilized to temporarily accommodate connectors 101C of the tubing 101P.

After utilizing the fixture 121 to hold the tubing 101P, the chemical 199 dripping out from an opening of each of the tubing 101P can be collected by the leakage container 122. As will be discussed in FIG. 3A to FIG. 5F, an auxiliary fixture 121F can be fastened to the tubing 101P and further fixed to the fixture 121. Alternatively, the tubing 101P can be fastened by coupling the connectors 101C of the tubing 101P to the fixture 122C configured on the leakage container 122, thus the chemical 199 dripping out from an opening of each of the tubing 101P can be collected by the leakage container 122.

In operation 1021, the used chemical container 101 is removed from the chemical supply chamber 101M and the next chemical container 101 is moved into the chemical supply chamber 101M. The chemical stored in the next chemical container may be identical or similar to the chemical stored in the used chemical container 101. The tubing 101P are removed from the interlock apparatus 120 and connected to a next chemical container 101. The connection mechanism between the tubing 101P and the used chemical container 101 may be identical to the connection mechanism between the tubing 10P and the next chemical container 101.

In operation 1027, the operator transmits a finalization instruction to the controller 103 (for example, through the operation interface 102) and the chemical 199 is supplied from the next chemical container 101 and flowed through the tubing 101P.

In operation 1030, the sensors disposed on the tubing 101P and/or the next chemical container 101 transmit parameters related to the flow of chemical 199, so the flow of chemical 199 can be monitored and the result of chemical container replacement operation can be confirmed.

As discussed previously, in order to prevent the scenario of chemical 199 being supplied from the next chemical container 101 and flowed through the tubing 101P prior to connected each of the tubing 101P to the next chemical container 101, which would cause chemical leakage, the interlock apparatus 120 (discussed in operation 1018) monitors the position of the tubing 101P and performs foolproof checking operation so as to ensure that the chemical 199 would not be mistakenly supplied from the next chemical container 101 prior to each of the tubing 101P being connected to the next chemical container 101. The details and mechanism of the interlock apparatus 120 would be subsequently discussed in FIG. 2B, FIG. 2C and FIG. 3A to FIG. 8C.

Figure 2B:
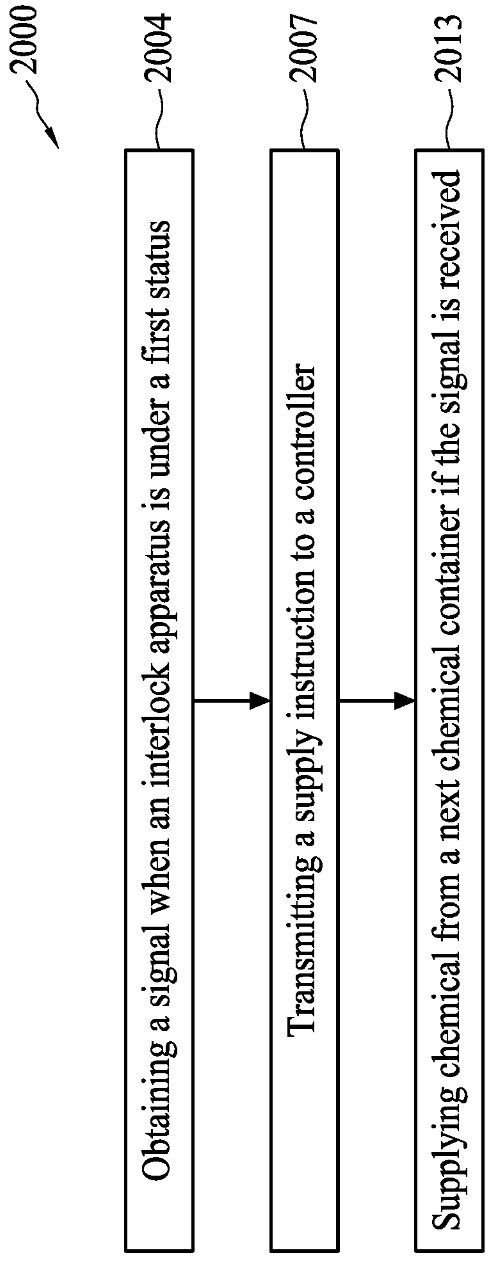
FIG. 2B shows a flow chart representing a method for exchanging chemical supply container, in accordance with some embodiments of the present disclosure.

Referring to FIG. 2B, FIG. 2B shows a flow chart representing a method for exchanging chemical supply container, in accordance with some embodiments of the present disclosure. The method 2000 for exchanging chemical supply container includes obtaining a signal when an interlock apparatus is under a first status (operation 2004), transmitting a supply instruction to a controller (operation 2007), and supplying chemical from a next chemical container if the signal is received (operation 2013).

Figure 2C:
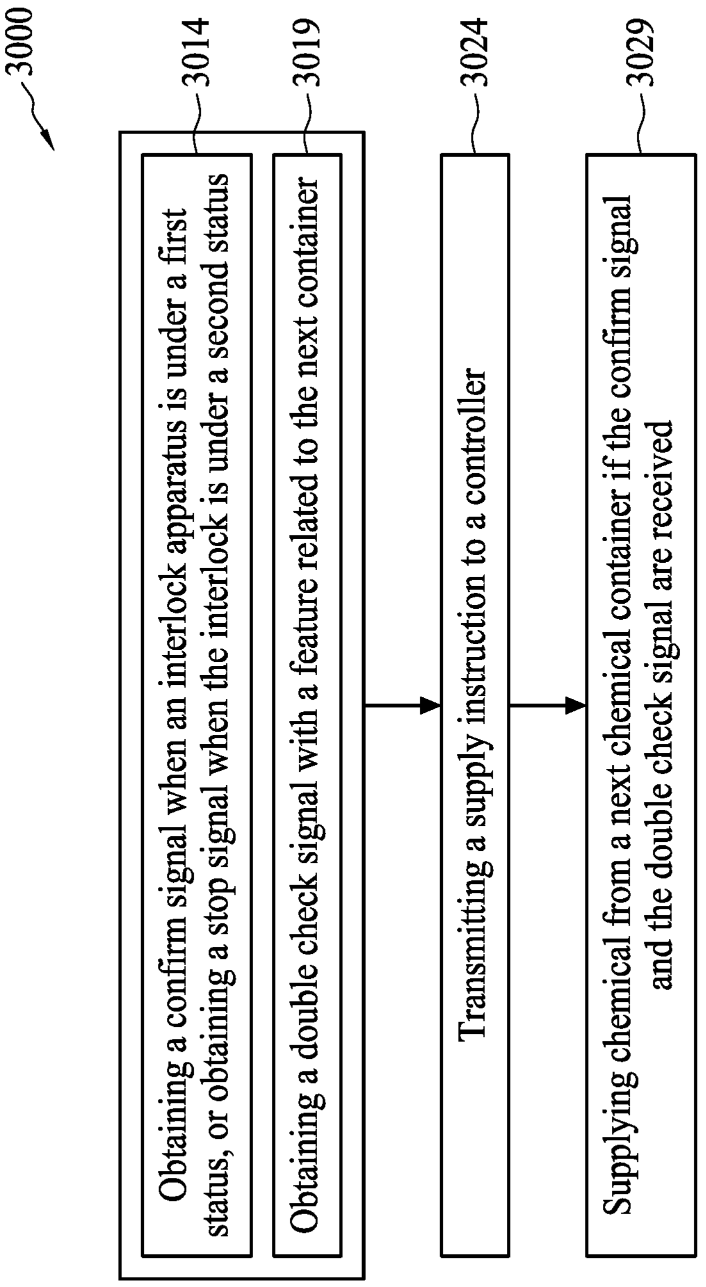
FIG. 2C shows a flow chart representing a method for exchanging chemical supply container, in accordance with some embodiments of the present disclosure.

Referring to FIG. 2C, FIG. 2C shows a flow chart representing a method for exchanging chemical supply container, in accordance with some embodiments of the present disclosure. The method 3000 for exchanging chemical supply container includes obtaining a confirm signal when an interlock apparatus is under a first status, or obtaining a stop signal when the interlock is under a second status (operation 3014, which can be referred to FIG. 3D to FIG. 3F, FIG. 4D to FIG. 4F, FIG. 5D to FIG. 5F, FIG. 7A to FIG. 7C, or FIG. 8A to FIG. 8C), obtaining a double check signal with a feature related to the next chemical container (operation 3019), transmitting a supply instruction to a controller (operation 3024), supplying chemical from the next chemical container if the confirm signal and the double check signal are received (operation 3029).

FIG. 3A to FIG. 3F discuss an interlock apparatus 120A utilizing first approach of incorporating optical sensors.

Referring to FIG. 1D and FIG. 3A to FIG. 3C, FIG. 3A is a perspective view showing an interlock apparatus for chemical supply system, FIG. 3B is a schematic drawing illustrating a connector, FIG. 3C is an exploded drawing illustrating a connector, in accordance with some embodiments of the present disclosure. The interlock apparatus 120A includes an emitter 170E configured to emit a radiation (such as infrared or light) and a receiver 170R configured to receive the radiation. The radiation generated from the emitter 170E may be at a level above the leakage container 122 (which may include the first and second leakage container 122A, 122B), and may be at a level below or similar to the fixture 121 (e.g. may include the first and second fixture 121A, 121B). The emitter 170E and the receiver 170R may be held by a fixed supporter 170F, wherein the fixed supporter 170F may be disposed on the inner sidewall(s) 120W or other suitable position, depending on the configuration of the interlock apparatus 120A and the chemical supply chamber 101M.

In some embodiments, an auxiliary fixture 121F can be fastened on each of the tubing 10P removed from the used chemical container 101, and subsequently coupled to one fixture 121. For example, the fixture 121 can be a socket that includes a recess 121R, and the auxiliary fixture 121F may have a protrusion structure or a pin that can be connected to the fixture 121. In some embodiments, the auxiliary fixture 121F may include multiple portions, such as a first portion 121F' and a second portion 121F" corresponding to the first portion 121F', and the tubing 101P can be clipped between the first portion 121F' and the second portion 121F", wherein the first portion 121F' and the second portion 121F" can be further fastened by a fastener. In some alternative embodiments, the auxiliary fixture 121F may also be fastened to the connectors 101C. By utilizing the auxiliary fixture 121F, the widely used or existing design of tubing 101P and the connectors 101C does not need to be changed, and the auxiliary fixture 121F can be reused in multiple chemical container replacement operations, thereby the cost may be reduced and the efficiency may be improved. In some embodiments, after coupling the auxiliary fixture 121F (or the tubing 101P) to the fixture 121, the connectors 101C or a portion of the tubing 101P is laterally surrounded by the leakage container 122 (shown in FIG. 3E or FIG. 3F).

Referring to FIG. 1D and FIG. 3D, FIG. 3D is a perspective view showing an interlock apparatus under a first status, in accordance with some embodiments of the present disclosure. When the tubings 101P are still connected to the used chemical container 101, the tubings 101P are not coupled to the interlock apparatus 120A, wherein the status of the interlock apparatus 120A without coupling to any tubing 101P can be referred to as a first status. As discussed in FIG. 3A to FIG. 3C, the emitter 170E and the receiver 170R are configured to determine the status of the interlock apparatus 120A. For example, when the receiver 170R successfully receives the radiation irradiated from the emitter 170E, a first signal is transmitted to the controller 103, and the controller 103 can obtain the first signal indicating that the tubing 101P is currently not coupled to the interlock apparatus 120A. In some embodiments, the determining operation performed by the emitter 170E and the receiver 170R may be initiated prior to removing the tubing 101P from the used chemical container 101, and ends until the supplying of chemical. In some other alternative embodiments, the determining operation performed by the emitter 170E and the receiver 170R may be normally active so the determination is continuously performed.

Referring to FIG. 1D and FIG. 3E, FIG. 3E is a perspective view showing an interlock apparatus under a second status, in accordance with some embodiments of the present disclosure. After the tubing 101P removed from the used chemical container 101 are coupled to the interlock apparatus 120A, the connectors 101C (or alternatively, a portion of the tubing 101P or the auxiliary fixture 121F) is positioned at a level that blocks the path of the radiation emitted from the emitter 170E, thereby the receiver 170R may not receive the radiation, or, most of the radiation is not received by the receiver 170R. In some of the embodiments, the fixture(s) 121 are positioned at a level that after coupling the tubing 101P to the fixture(s) 121, a portion of the connectors 101C, a portion of the tubing 101P or the auxiliary fixture 121F is at a level same as the level of the emitter 170E and/or the receiver 170R. Under the circumstances of every tubing 101P removed from the used chemical container 101 being coupled to the interlock apparatus 120A (herein referred to as the interlock apparatus 120A being under a second status), a second signal is transmitted to the controller 103, wherein the controller 103 can obtain the second signal indicating that at least one of the tubing 10P is currently not coupled to the used chemical container 101 or the next chemical container 101. In some embodiments, the first signal may be terminated when the interlock apparatus 120A becomes second status.

Referring to FIG. 1D and FIG. 3F, FIG. 3F is a perspective view showing an interlock apparatus in third status, in accordance with some embodiments of the present disclosure. In some of the embodiments, one emitter 170E and one receiver 170R may be configured to monitor the presence of multiple tubing 101P. In some cases, chemical leakage may occur even when operator only forgot to connect one tubing 101P to the next chemical container 101 even while other tubing 101P are connected properly. Therefore, the positions of the fixture 121 (e.g. may include the first and second fixture 121A, 121B), the emitter 170E and the receiver 170R may be configured in a fashion that the radiation from the emitter 170E toward the receiver 170R may still be blocked when not every tubing 101P are decoupled from the interlock apparatus 120A. Under the circumstances of at least one of the tubing 101P removed from the used chemical container 101 is still coupled to the interlock apparatus 120A (herein referred to as the interlock apparatus 120A being in third status), the second signal is transmitted to the controller 103, and the controller 103 can obtain the second signal indicating that at least one of the tubing 101P is currently not coupled to the used chemical container 101 or the next chemical container 101. In some embodiments, the first signal may be terminated when the interlock apparatus 120A becomes third status.

On the other hand, when each of the tubing 101P coupled to the interlock apparatus 120A are removed, the interlock apparatus 120A would become first status (discussed in FIG. 3A) as the receiver 170R may be able to receive radiation from the emitter 170E, thereby transmitting the first signal to the controller 103. In some embodiments, when the interlock apparatus 120A is changed from second status or third status to first status, the first signal is triggered and the second signal is terminated.

In the embodiments, the detectable feature 101T attached to the tubing 101P (and/or the next chemical container 101) will be determined, confirmed or scanned again for the operator to confirm that each of the tubing 101P are properly connected to the next chemical container 101. A double check signal may be sent to the controller 103 to indicate that the operator finished the connection between the tubing 101P and the next chemical container 101.

The aforementioned multi-step foolproof mechanism of the interlock apparatus 120A includes that the controller may receive a first signal before the beginning of replacement operation, followed by a second after coupling at least one of the tubing 101P to the interlock apparatus 120A, followed by the first signal after every tubing 101P coupled to the interlock apparatus 120A, and a double check signal after confirming the connection between the tubing 101P and the next chemical container 101.

After the operator believes that every tubing 101P are properly connected to the next chemical container 101, the operator can transmit a supply signal to the controller 103 in order to instruct the next chemical container 101 to supply chemical. In the scenario of either the double check signal or the first signal subsequent to the second signal is not obtained, the interlock mechanism would be activated as the controller 103 may either receive or generate a cancellation signal for instructing to cease (or not to execute) the supply operation, thereby preventing the chemical from being supplied and leaked out. Alternatively, when the controller 103 still detects or obtains the second signal, the controller 103 may either receive or generate a cancellation signal for instructing to cease (or not to execute) the supply operation, thereby preventing the chemical from being supplied and leaked out.

In the cases of the controller 103 receives both of the double check signal and the first signal subsequent to the second type signal, the controller 103 execute the supply operation of the next chemical container 101, and the chemical 199 starts flowing through the suction port 101S.

Referring back to FIG. 1A to FIG. 1D and FIG. 2A, the chemical starts circulating in the tubing 101P upon the supply instruction. Sensors (not shown) disposed on the tubing 101P and/or the next chemical container 101 transmit parameters related to the flow of chemical, and determines if the chemical eventually returns to the next chemical container 101 through the return port 101R and back to the next chemical container 101. In the cases of the circulation does not reach expectation or the return port 101R fails to receive chemical, an alarm may occur and halt the supply.

In some embodiments, the auxiliary fixture 121F may be removed from the tubing 101P after decoupling the tubing 101P from the interlock apparatus 120A so that the auxiliary fixture 121F can be reused repeatedly in other chemical container replacement operations.

It should be noted that although the example of using one receiver 170R and one emitter 170E configured to simultaneously detecting the presence of the tubing 101P at the interlock apparatus 120A is shown in FIG. 3A to FIG. 3F, and more than one receivers 170R or emitters 170E can be utilized to determine the status of tubing 101P separately to comply with the configuration in the chemical supply chamber 101M.

The interlock method and mechanism subsequently discussed in FIG. 4A to FIG. 4F is similar to FIG. 1D and FIG. 3A to FIG. 3F, the difference resides in that an interlock apparatus 120B discussed in FIG. 4A to FIG. 4F utilizes a second approach of incorporating proximity sensors. Hereinafter the elements in FIG. 4A to FIG. 4F labeled with same number as FIG. 1D and FIG. 3A to FIG. 3F would not be repeatedly described. The details of similar elements can be referred to the above discussion and FIG. 1A to FIG. 1D and FIG. 3A to FIG. 3F.

Referring to FIG. 4A to FIG. 4B, FIG. 4A is a perspective view showing an interlock apparatus for chemical supply system, FIG. 4B is a top perspective view showing an interlock apparatus for chemical supply system, in accordance with some embodiments of the present disclosure. The interlock apparatus 120B includes proximity sensor 180 for determining whether the tubing 101P are coupled to the interlock apparatus 120B or not. In some embodiments, each of the leakage container 122 (e.g. may include the first and second leakage container 122A, 122B) may include a proximity sensor 180 pointing toward the position for accommodating the corresponding tubing 101P. In some cases, each of the proximity sensor 180 are disposed in a fashion that would not interfere with each other, for example, one proximity sensor 180 may not directly block the sensing side of another the proximity sensor 180 from determining targeted range thereof. In some embodiments, the proximity sensor(s) 180 can be fixed, which may be achieved by various forms of supporting structure (not shown).

In some embodiments, the proximity sensor 180 may be capacitive sensor. Capacitive sensors are configured for non-contact measurement of distance and position, and may possess the advantage of anti-corrosion, high stability and/or high accuracy. Capacitive sensors may also have a compact size comparing to various types of sensors, thus serving the purpose of space-saving.

In some embodiments, prior to replacing the used chemical container 101, the accuracy of the proximity sensor 180 can be adjusted according to the size of the leakage container 122. For example, a proximity sensor 180 may be able to sense the object distanced in a range from about 3 mm to about 25 mm, and by performing adjustment, the sensing distance can be narrowed to predetermined ranges, for example, in a range from about 10 mm to 15 mm. (The ranges and distances are not limited thereto and is merely used as an example.)

Referring to FIG. 4C, FIG. 4C is an exploded drawing illustrating a connector, a fixture and an auxiliary fixture, in accordance with some embodiments of the present disclosure. Similar to the discussion in FIG. 3C, an auxiliary fixture 121F can be fastened on one tubing 101P removed from the used chemical container 101, and subsequently coupled to one fixture 121. In some embodiments, the auxiliary fixture 121F may include multiple portions, such as a first portion 121F' and a second portion 121F" corresponding to the first portion 121F', and the tubing 101P can be clipped between the first portion 121F' and the second portion 121F", wherein the first portion 121F' and the second portion 121F" can be further fastened by a fastener. In some alternative embodiments, the auxiliary fixture 121F may also be fastened to the connectors 101C. After coupling the auxiliary fixture 121F (or the tubing 101P) to the fixture 121, a portion of the connectors 101C or a portion of the tubing 101P is above the leakage container 122 and spaced away from the proximity sensor 180 by the predetermined sensing distance. For example, in some of the embodiments, a first portion of the connectors 101C is laterally surrounded by the leakage container 122 and a second portion of the connectors 101C is exposed from the top of the leakage container 122. The proximity sensor 180 can be utilized to detect the second portion of the connectors 101C.

Referring to FIG. 4D, FIG. 4D is a perspective view showing an interlock apparatus under a first status, in accordance with some embodiments of the present disclosure. Similar to the discussion in FIG. 3D, when the tubings 101P are still connected to the used chemical container 101, the tubing 101P is not coupled to the interlock apparatus 120B, wherein the status of the interlock apparatus 120B without coupling to any tubing 101P can be referred to as a first status. As discussed in FIG. 4A to FIG. 4C, the proximity sensors 180 are configured to determine the status of the interlock apparatus 120B. For example, when each of the proximity sensor 180 does not detect the presence of corresponding tubing 101P (in some embodiments, such as a connector 101C of the tubing 101P), a first signal is transmitted to the controller 103, and the controller 103 can obtain the first signal indicating that the tubing 101P is currently not coupled to the interlock apparatus 120B. In some embodiments, the determining operation performed by the proximity sensor 180 may be initiated prior to removing the tubing 101P from the used chemical container 101, and ends until the supplying of chemical. In some other alternative embodiments, the determining operation performed by the proximity sensor 180 may be normally active so the determination is continuously performed.

Referring to FIG. 4E, FIG. 4E is a perspective view showing an interlock apparatus under a second status, in accordance with some embodiments of the present disclosure. Similar to the discussion in FIG. 3E, after coupling the tubing 101P removed from the used chemical container 101 to the interlock apparatus 120B, the connectors 101C (or alternatively, a portion of the tubing 101P or the auxiliary fixture 121F) is at a position that can be detected by the proximity sensor 180 (i.e. within the predetermined ranges of the sensing distance thereof). In some of the embodiments, the fixtures 121 are positioned at a level that after coupling the tubing 101P the fixtures 121, a portion of the connectors 101C, a portion of the tubing 101P or the auxiliary fixture 121F is at a level same as the level of the proximity sensor 180. Under the circumstances of every tubing 101P removed from the used chemical container 101 are coupled to the interlock apparatus 120B (herein referred to as the interlock apparatus 120B being under a second status), a second signal is transmitted to the controller 103, and the controller 103 can obtain the second signal indicating that at least one of the tubing 101P is currently not coupled to the used chemical container 101 or the next chemical container 101. In some embodiments, the first signal may be terminated when the interlock apparatus 120B becomes second status.

Referring to FIG. 4F, FIG. 4F is a perspective view showing an interlock apparatus in third status, in accordance with some embodiments of the present disclosure. Similar to the discussion in FIG. 3F, under the circumstances of at least one of the tubing 101P removed from the used chemical container 101 is still coupled to the interlock apparatus 120B (herein referred to as the interlock apparatus 120B being in third status), the second signal is transmitted to the controller 103, and the controller 103 can obtain the second signal indicating that at least one of the tubing 101P is currently not coupled to the used chemical container 101 or the next chemical container 101. In some embodiments, the first signal may be terminated when the interlock apparatus 120B becomes third status.

On the other hand, when each of the tubing 101P coupled to the interlock apparatus 120B are removed, the interlock apparatus 120B would be become first status (discussed in FIG. 4A) as the proximity sensor 180 does not detect the presence of the tubing 101P, thereby transmitting the first signal to the controller 103. In some embodiments, when the interlock apparatus 120B is changed from second status or third status to first status, the first signal is triggered and the second signal is terminated.

In the embodiments, the detectable feature 101T attached to the tubing 101P (and/or the next chemical container 101) will be determined, confirmed or scanned again for the operator to confirm that each of the tubing 101P are properly connected to the next chemical container 101. A double check signal may be sent to the controller 103 to indicate that the operator finished the connection between the tubing 101P and the next chemical container 101.

The aforementioned multi-step foolproof mechanism of the interlock apparatus 120B includes that the controller may receive a first signal before the beginning of replacement operation, followed by a second signal after coupling at least one of the tubing 101P to the interlock apparatus 120B, followed by the first signal after every tubing 101P coupled to the interlock apparatus 120B, and a double check signal after confirming the connection between the tubing 101P and the next chemical container 101.

After the operator believes that every tubing 101P are properly connected to the next chemical container 101, the operator can transmit a supply signal to the controller 103 in order to instruct the next chemical container 101 to supply chemical. In the scenario of either the double check signal or the first signal subsequent to the second signal is not obtained, the interlock mechanism would be activated as the controller 103 may either receive or generate a cancellation signal for instructing to cease (or not to execute) the supply operation, thereby preventing the chemical from being supplied and leaked out. Alternatively, when the controller 103 still detects or obtains the second signal, the controller 103 may either receive or generate a cancellation signal for instructing to cease (or not to execute) the supply operation, thereby preventing the chemical from being supplied and leaked out.

In the cases of the controller 103 receives both of the double check signal and the first signal subsequent to the second type signal, the controller 103 execute the supply operation of the next chemical container 101, and the chemical 199 starts flowing through the suction port 101S. Similar to the previous discussion in FIG. 1A to FIG. 1D and FIG. 2A, the circulation of the chemical 199 in the tubing 101P can be monitored.

In some embodiments, the auxiliary fixture 121F may be removed from the tubing 101P after decoupling the tubing 101P from the interlock apparatus 120B so that the auxiliary fixture 121F can be reused repeatedly in other chemical container replacement operations.

The interlock method and mechanism subsequently discussed in FIG. 5A to FIG. 5F is similar to FIG. 1D and FIG. 3A to FIG. 3F or FIG. 4A to FIG. 4F, the difference resides in that an interlock apparatus 120C discussed in FIG. 5A to FIG. 5F utilizes a third approach of incorporating electrical switch (such as reed switch, electromagnetic switch, piezoelectric sensor, or the like) and a determination circuit. Hereinafter the elements in FIG. 5A to FIG. 5F labeled with same number as FIG. 1D and FIG. 3A to FIG. 3F or FIG. 4A to FIG. 4F would not be repeatedly described. The details of similar elements can be referred to the above discussion and FIG. 1A to FIG. 1D and FIG. 3A to FIG. 3F or FIG. 4A to FIG. 4F.

Referring to FIG. 5A, FIG. 5A is a perspective view showing an interlock apparatus for chemical supply system, in accordance with some embodiments of the present disclosure. The interlock apparatus 120C includes first portion 190A of electrical switch for determining whether the tubing 101P are coupled to the interlock apparatus 120C or not. In some embodiments, the first portion 190A of electrical switch may be a portion of reed switch, electromagnetic switch, piezoelectric sensor, or the like. In some embodiments, each of the fixture 121 (for example, may include the first fixture 121A and the second fixture 121B) may include one first portion 190A of electrical switch. In some embodiments, the first portion 190A of electrical switch may be disposed at a position adjacent to the recess 121R of the fixture 121, such as proximal to or aligned with a bottom or a sidewall of the recess 121R. The first portion 190A is electrically connected to a determination circuit 190C of the interlock apparatus 120C.

Referring to FIG. 5B and FIG. 5C, FIG. 5B is a perspective view showing a connector of a tubing, FIG. 5C is an exploded drawing illustrating a connector, a fixture and an auxiliary fixture, in accordance with some embodiments of the present disclosure. Similar to the discussion in FIG. 3C or FIG. 4C, an auxiliary fixture 121F can be fastened on one tubing 101P removed from the used chemical container 101, and subsequently coupled to one fixture 121. In some embodiments, the auxiliary fixture 121F may include multiple portions, such as a first portion 121F' and a second portion 121F" corresponding to the first portion 121F', and the tubing 101P can be clipped between the first portion 121F' and the second portion 121F", wherein the first portion 121F' and the second portion 121F" can be further fastened by a fastener. In some alternative embodiments, the auxiliary fixture 121F may also be fastened to the connectors 101C.

A second portion 190B of electrical switch corresponding to the first portion 190A is disposed over the auxiliary fixture 121F. In some embodiments, the second portion 190B of electrical switch may be a portion of reed switch, electromagnetic switch, piezoelectric sensor, or the like, which may be identical or complementary to the type of the first portion 190A. In some embodiments, each of the auxiliary fixture 121F may include one second portion 190B of electrical switch. After coupling the auxiliary fixture 121F to the fixture 121, the first portion 190A and the second portion 190B are in direct physical contact, or, the first portion 190A is substantially adjacent to the second portion 190B.

In some embodiments, the first portion 190A may be unparalleled to the second portion 190B. For example, the first portion 190A may be substantially perpendicular to the second portion 190B. In some alternative embodiments, the first portion 190A may be parallel to the second portion 190B. The relative position of the first portion 190A and the second portion 190B may be in accordance with the configuration of the auxiliary fixture 121F and the fixture 121. For example, the second portion 190B may be attached to an outer sidewall of the auxiliary fixture 121F, and a bottom surface of the second portion 190B may be in direct contact with a top surface of the first portion 190A, as will be subsequently discussed in FIG. 5E.

Figure 5D:
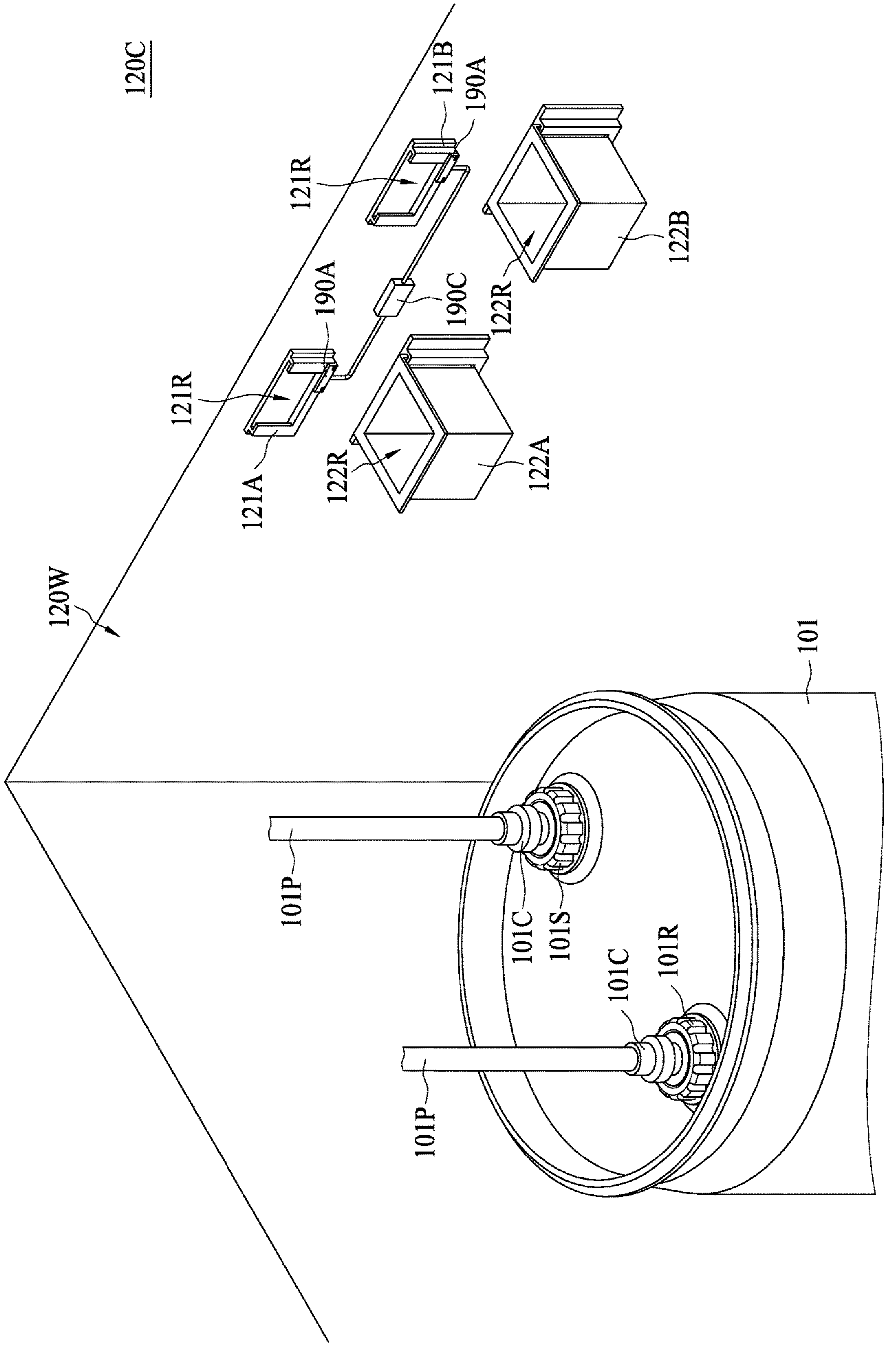
FIG. 5D is a perspective view showing an interlock apparatus under a first status, in accordance with some embodiments of the present disclosure.

Referring to FIG. 5D, FIG. 5D is a perspective view showing an interlock apparatus under a first status, in accordance with some embodiments of the present disclosure. Similar to the discussion in FIG. 3D or FIG. 4D, when the tubings 101P are still connected to the used chemical container 101, the tubing 101P is not coupled to the interlock apparatus 120C, wherein the status of the interlock apparatus 120C without coupling to any tubing 101P can be referred to as a first status. As discussed in FIG. 5A to FIG. 5C, the relative position between the first portion 190A and the second portion 190B can be utilized as an indication of the status of the interlock apparatus 120C. For example, when the first portion 190A and the second portion 190B are not electrically connected (or not in direct physical contact), the first portion 190A and the second portion 190B would constitute an open circuit for the determination circuit 190C of the interlock apparatus 120C. Thereby, a first signal is transmitted to the controller 103, and the controller 103 can obtain the first signal indicating that the tubing 101P is currently not coupled to the interlock apparatus 120C.

Figure 5E:
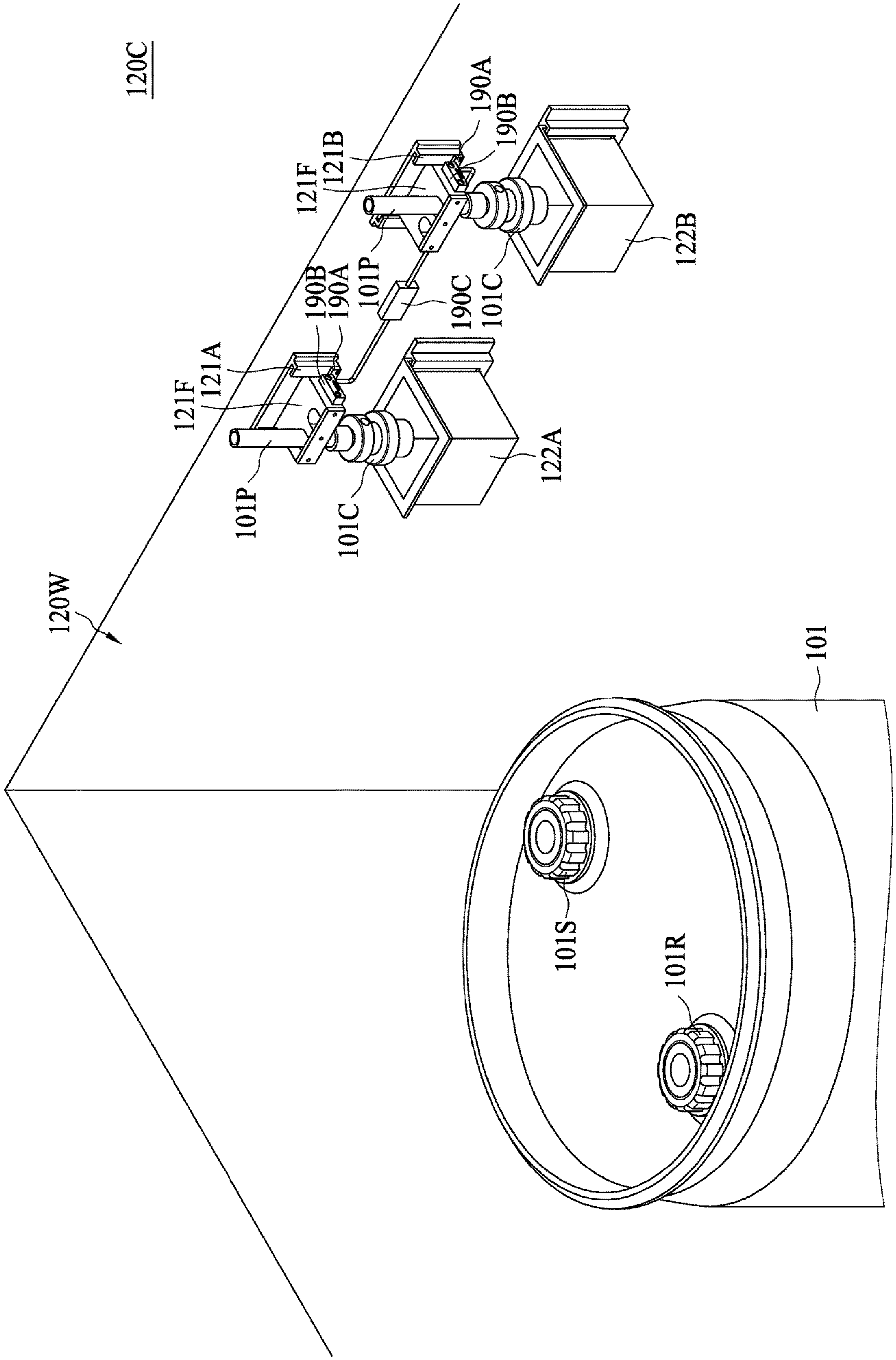
FIG. 5E is a perspective view showing an interlock apparatus under a second status, in accordance with some embodiments of the present disclosure.

Referring to FIG. 5E, FIG. 5E is a perspective view showing an interlock apparatus under a second status, in accordance with some embodiments of the present disclosure. Similar to the discussion in FIG. 3E or FIG. 4E, after coupling the tubing 101P removed from the used chemical container 101 to the interlock apparatus 120C, the first portion 190A and the second portion 190B may be electrically connected (or substantially in direct physical contact), the first portion 190A and the second portion 190B would constitute a closed, connected circuit for the determination circuit 190C of the interlock apparatus 120C. As previously discussed, the first portion 190A and the second portion 190B are configured to be in direct physical contact or electrical connection after coupling the auxiliary fixture 121F to the fixture 121, Under the circumstances of every tubing 101P removed from the used chemical container 101 are coupled to the interlock apparatus 120C (herein referred to as the interlock apparatus 120C being under a second status), a second signal is transmitted to the controller 103, and the controller 103 can obtain the second signal indicating that at least one of the tubing 101P is currently not coupled to the used chemical container 101 or the next chemical container 101. In some embodiments, the first signal may be terminated when the interlock apparatus 120C becomes second status.

Figure 5F:
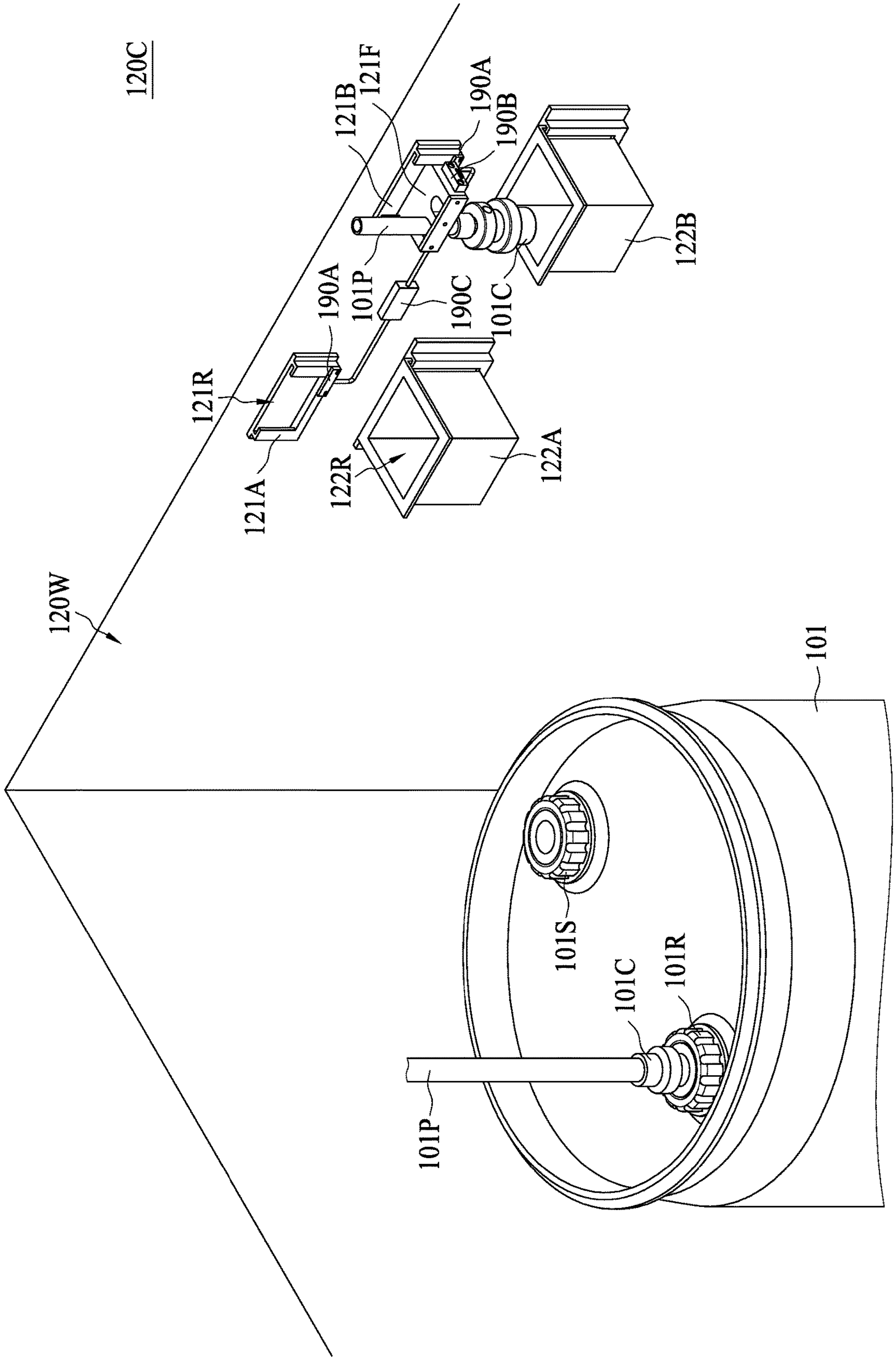
FIG. 5F is a perspective view showing an interlock apparatus under a third status, in accordance with some embodiments of the present disclosure.

Referring to FIG. 5F, FIG. 5F is a perspective view showing an interlock apparatus in third status, in accordance with some embodiments of the present disclosure. Similar to the discussion in FIG. 3F or FIG. 4F, under the circumstances of at least one of the tubing 101P removed from the used chemical container 101 is still coupled to the interlock apparatus 120C (herein referred to as the interlock apparatus 120C being in third status), at least one pair of first portion 190A and second portion 190B may be electrically connected (or substantially in direct physical contact), thus constituting a closed, connected circuit for the determination circuit 190C of the interlock apparatus 120C. The second signal is thus transmitted to the controller 103, and the controller 103 can obtain the second signal indicating that at least one of the tubing 101P is currently not coupled to the used chemical container 101 or the next chemical container 101. In some embodiments, the first signal may be terminated when the interlock apparatus 120C becomes third status.

On the other hand, when each of the tubing 101P coupled to the interlock apparatus 120C are removed, the interlock apparatus 120C would be become first status (discussed in FIG. 5A) as the determination circuit 190C determines that each pair of the first portion 190A and second portion 190B are separated. In some embodiments, when the interlock apparatus 120C is changed from second status or third status to first status, the first signal is triggered and the second signal is terminated.

In the embodiments, the detectable feature 101T attached to the tubing 101P (and/or the next chemical container 101)

will be determined, confirmed or scanned again for the operator to confirm that each of the tubing 101P are properly connected to the next chemical container 101. A double check signal may be sent to the controller 103 to indicate that the operator finished the connection between the tubing 101P and the next chemical container 101.

The aforementioned multi-step foolproof mechanism of the interlock apparatus 120C includes that the controller may receive a first signal before the beginning of replacement operation, followed by a second signal after coupling at least one of the tubing 101P to the interlock apparatus 120C, followed by the first signal after every tubing 101P coupled to the interlock apparatus 120C, and a double check signal after confirming the connection between the tubing 101P and the next chemical container 101.

After the operator believes that every tubing 101P are properly connected to the next chemical container 101, the operator can transmit a supply signal to the controller 103 in order to instruct the next chemical container 101 to supply chemical. In the scenario of either the double check signal or the first signal subsequent to the second type signal is not obtained, the interlock mechanism would be activated as the controller 103 may either receive or generate a cancellation signal for instructing to cease (or not to execute) the supply operation, thereby preventing the chemical from being supplied and leaked out. Alternatively, when the controller 103 still detects or obtains the second signal, the controller 103 may either receive or generate a cancellation signal for instructing to cease (or not to execute) the supply operation, thereby preventing the chemical from being supplied and leaked out.

In the cases of the controller 103 receives both of the double check signal and the first signal subsequent to the second type signal, the controller 103 execute the supply operation of the next chemical container 101, and the chemical 199 starts flowing through the suction port 101S. Similar to the previous discussion in FIG. 1A to FIG. 1D and FIG. 2A, the circulation of the chemical 199 in the tubing 101P can be monitored.

In some embodiments, the auxiliary fixture 121F may be removed from the tubing 101P after decoupling the tubing 101P from the interlock apparatus 120C so that the auxiliary fixture 121F can be reused repeatedly in other chemical container replacement operations. Since the second portion 190B may be disposed at the auxiliary fixture 121F, the second portion 190B is also detached from the tubing 101P and can be directly utilized in other chemical container replacement operations.

Figure 6A:
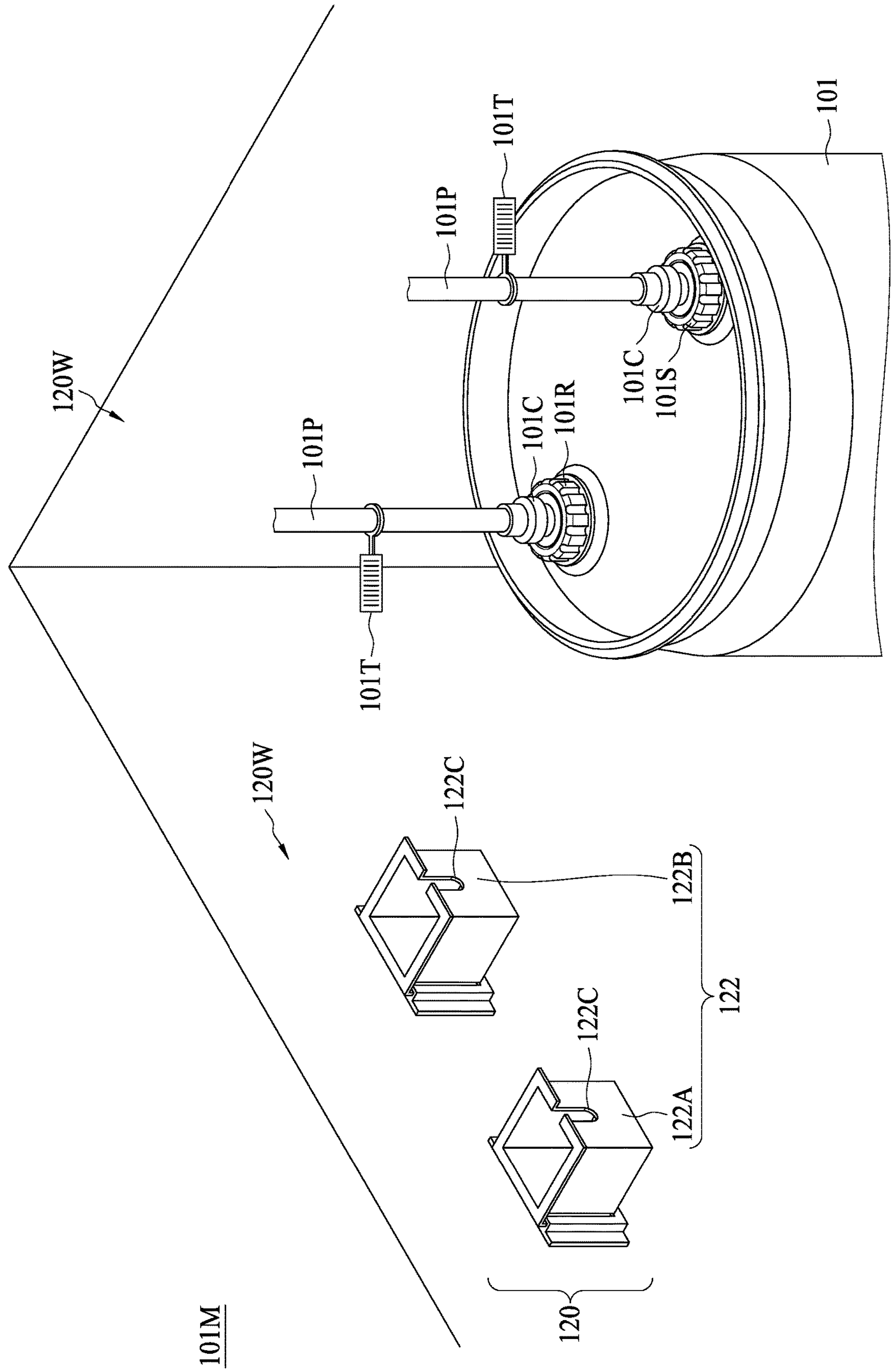
FIG. 6A is a schematic drawing illustrating a chemical supply chamber and a chemical supply container, according to some embodiments of the present disclosure.
Figure 6B:
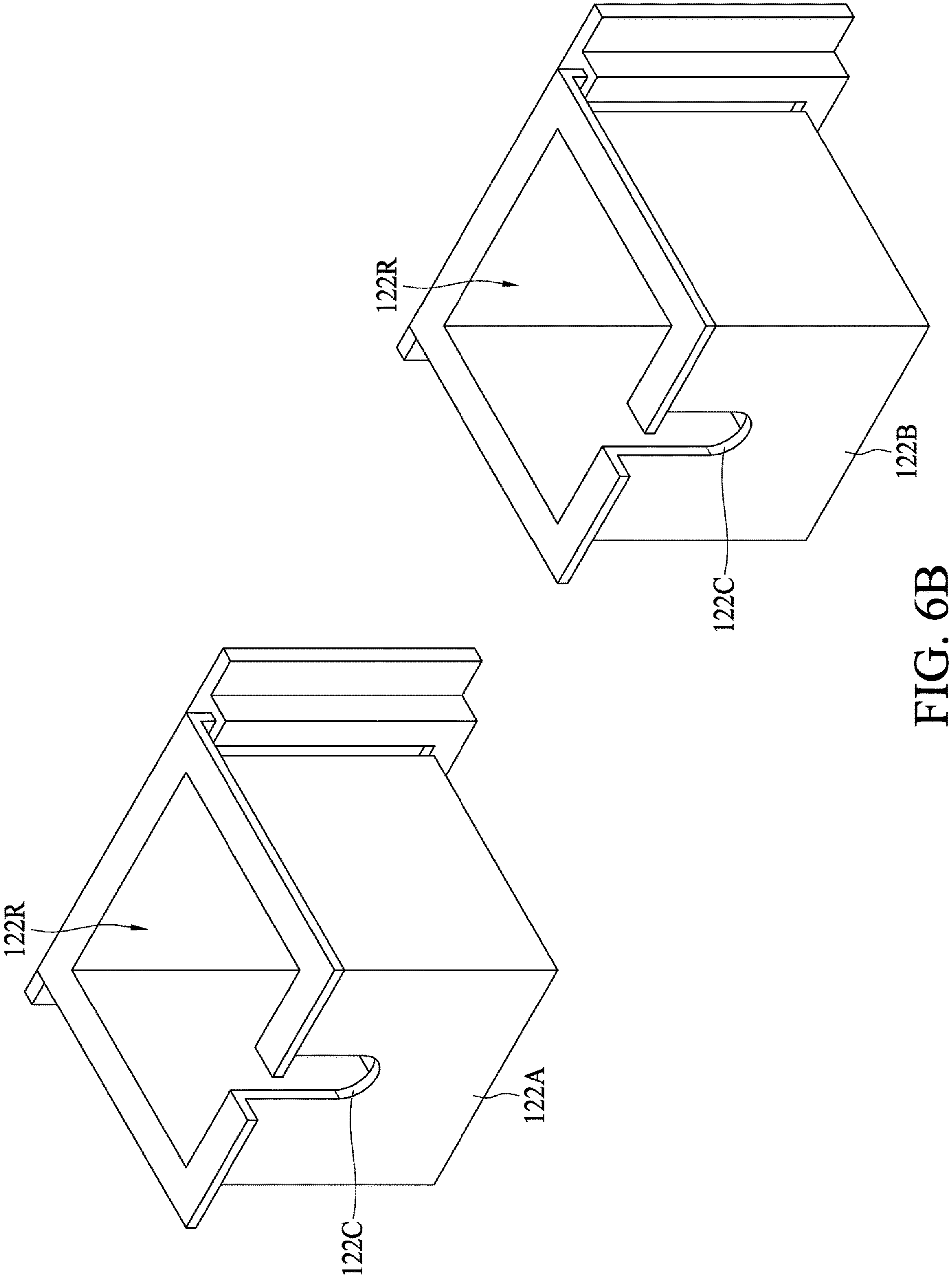
FIG. 6B is a perspective view showing a leakage container, in accordance with some embodiments of the present disclosure.

Referring to FIG. 6A and FIG. 6B, FIG. 6A is a schematic drawing illustrating a chemical supply chamber and a chemical supply container, FIG. 6B is a perspective view showing a leakage container, in accordance with some embodiments of the present disclosure. In some of the cases, a space of the chemical supply chamber 101M may be narrow, or there may be a height difference between the leakage container 122 and the suction port 101S (or the return port 101R). In some of the embodiments, it may be difficult to route the tubing 101P in the space of the chemical supply chamber 101M in order to accommodate the connectors 101C into the leakage container 122 from upper side.

In some alternative embodiments, instead of utilizing fixtures 121A or 121B discussed in FIG. 3A to FIG. 5F, the interlock apparatus 120 includes a fixture 122C configured on a sidewall of the leakage container 122. In some embodiments, the fixture 122C can be a recess or similar mechanism configured to temporarily couple to or accommodate connectors 101C of the tubing 101P. In some embodiments, a sidewall of each of the connector 101C may be in direct contact with a sidewall of the fixture 122C, and the opening of connector 101C (or the tubing 101P) may be facing the inner sidewalls of the leakage container 122. Alternatively stated, the connectors 101C can be coupled to or accommodated in a direction different from vertical direction (such as in sideway or in tilted fashion). In some of the embodiments, the fixture 122C can be configured at a position requiring less extent of bending the tubing 101P, wherein such position may be related to the length of the tubing 101P in the chemical supply chamber 101M. Therefore, the embodiments subsequently discussed in FIG. 7A to FIG. 7C and FIG. 8A to FIG. 8C incorporates the aforesaid configuration of fixture 122C to the approaches discussed in FIG. 3A to FIG. .4F.

The interlock apparatus 120A' subsequently discussed in FIG. 7A to FIG. 7C is similar to the interlock apparatus 120A discussed in FIG. 3A to FIG. 3F, the difference resides in that the interlock apparatus 120A' discussed in FIG. 7A to FIG. 7C utilizes the aforesaid fixture 122C configured on a sidewall of the leakage container 122 to temporarily couple to (or accommodate) connectors 101C of the tubing 101P. The operations discussed in FIG. 1A to FIG. 2C and FIG. 3A to FIG. 3F can be applied to the interlock apparatus 120A' discussed in FIG. 7A to FIG. 7C.

Referring to FIG. 7A, FIG. 7A is a perspective view showing an interlock apparatus under a first status, in accordance with some embodiments of the present disclosure. Similar to the discussion in FIG. 3D, the interlock apparatus 120A' includes an emitter 170E configured to emit a radiation (such as infrared or light) and a receiver 170R configured to receive the radiation. The difference resides in that the radiation generated from the emitter 170E may be at a level of the leakage container 122 (which may include the first and second leakage container 122A, 122B).

As discussed in FIG. 7A to FIG. 7B, the fixture 122C is configured on a first sidewall 122E to temporarily couple to or accommodate connectors 101C of the tubing 101P. The leakage container 122 further includes through holes 122D configured on a second sidewall 122F for allowing the radiation to pass through the sidewalls of the leakage container 122. In some embodiments, the second sidewall 122F is different from the first sidewall 122E. In alternative embodiments, lens or optical devices (not shown) may be disposed on the second sidewall 122F for allowing the radiation to pass through the sidewalls of the leakage container 122.

When the tubings 101P are still connected to the used chemical container 101, the tubings 101P are not coupled to the interlock apparatus 120A', wherein the status of the interlock apparatus 120A' without coupling to any tubing 101P can be referred to as a first status. Similar to the discussion in FIG. 3A to FIG. 3C, the emitter 170E and the receiver 170R are configured to determine the status of the interlock apparatus 120A'. For example, when the receiver 170R successfully receives the radiation irradiated from the emitter 170E, a first signal is transmitted to the controller 103, and the controller 103 can obtain the first signal indicating that the tubing 101P is currently not coupled to the interlock apparatus 120A'.

Referring to FIG. 7B, FIG. 7B is a perspective view showing an interlock apparatus under a second status, in accordance with some embodiments of the present disclosure. Similar to the discussion in FIG. 3E, after the tubing 101P removed from the used chemical container 101 are coupled to the interlock apparatus 120A', the connectors 101C is positioned at a level that blocks the path of the radiation emitted from the emitter 170E, thereby the receiver 170R may not receive the radiation, or, most of the radiation is not received by the receiver 170R. Under the circumstances of every tubing 101P removed from the used chemical container 101 being coupled to the interlock apparatus 120A' (herein referred to as the interlock apparatus 120A' being under a second status), a second signal is transmitted to the controller 103, wherein the controller 103 can obtain the second signal indicating that at least one of the tubing 101P is currently not coupled to the used chemical container 101 or the next chemical container 101. In some embodiments, the first signal may be terminated when the interlock apparatus 120A' becomes second status.

Referring to FIG. 7C, FIG. 7C is a perspective view showing an interlock apparatus under a third status, in accordance with some embodiments of the present disclosure. Similar to the discussion in FIG. 3F, in some of the embodiments, one emitter 170E and one receiver 170R may be configured to monitor the presence of multiple tubing 101P. In some cases, chemical leakage may occur even when operator only forgot to connect one tubing 101P to the next chemical container 101 even while other tubing 101P are connected properly. Therefore, the positions of the fixture 121 (e.g. may include the first and second fixture 121A, 121B), the emitter 170E and the receiver 170R may be configured in a fashion that the radiation from the emitter 170E toward the receiver 170R may still be blocked when not every tubing 101P are decoupled from the interlock apparatus 120A'. Under the circumstances of at least one of the tubing 101P removed from the used chemical container 101 is still coupled to the interlock apparatus 120A' (herein referred to as the interlock apparatus 120A' being in third status), the second signal is transmitted to the controller 103, and the controller 103 can obtain the second signal indicating that at least one of the tubing 101P is currently not coupled to the used chemical container 101 or the next chemical container 101. In some embodiments, the first signal may be terminated when the interlock apparatus 120A' becomes third status.

On the other hand, when each of the tubing 101P coupled to the interlock apparatus 120A' are removed, the interlock apparatus 120A' would become first status (discussed in FIG. 7A) as the receiver 170R may be able to receive radiation from the emitter 170E, thereby transmitting the first signal to the controller 103. In some embodiments, when the interlock apparatus 120A' is changed from second status or third status to first status, the first signal is triggered and the second signal is terminated.

After the operator believes that every tubing 101P are properly connected to the next chemical container 101, the operator can transmit a supply signal to the controller 103 in order to instruct the next chemical container 101 to supply chemical. In the scenario of either the double check signal or the first signal subsequent to the second signal is not obtained, the interlock mechanism would be activated as the controller 103 may either receive or generate a cancellation signal for instructing to cease (or not to execute) the supply operation, thereby preventing the chemical from being supplied and leaked out. Alternatively, when the controller 103 still detects or obtains the second signal, the controller 103 may either receive or generate a cancellation signal for instructing to cease (or not to execute) the supply operation, thereby preventing the chemical from being supplied and leaked out.

In the cases of the controller 103 receives both of the double check signal and the first signal subsequent to the second type signal, the controller 103 execute the supply operation of the next chemical container 101, and the chemical 199 starts flowing through the suction port 101S. Similar to the previous discussion in FIG. 1A to FIG. 1D and FIG. 2A, the circulation of the chemical 199 in the tubing 101P can be monitored.

Figure 8B:
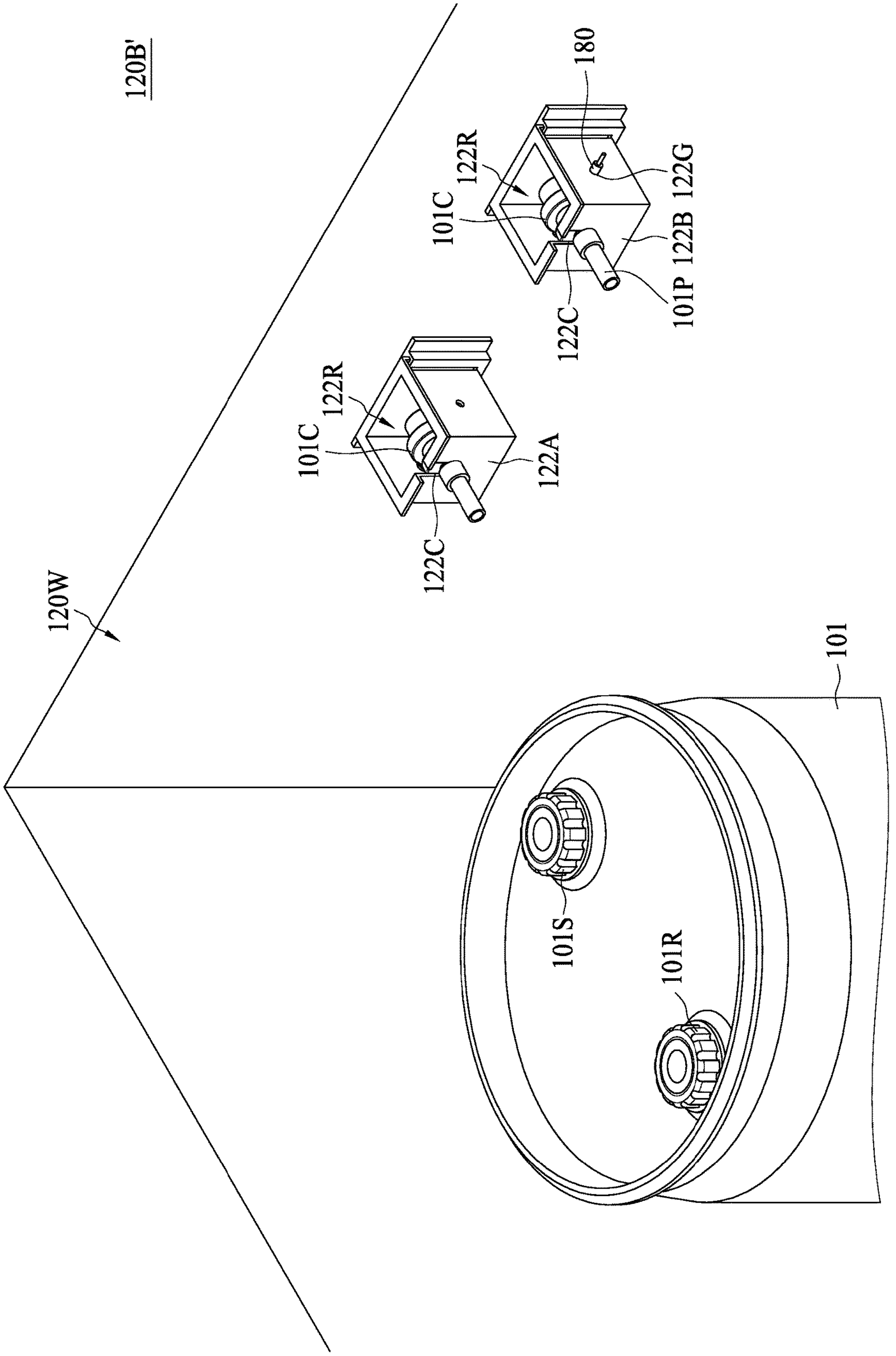
FIG. 8B is a perspective view showing an interlock apparatus under a second status, in accordance with some embodiments of the present disclosure.
Figure 8C:
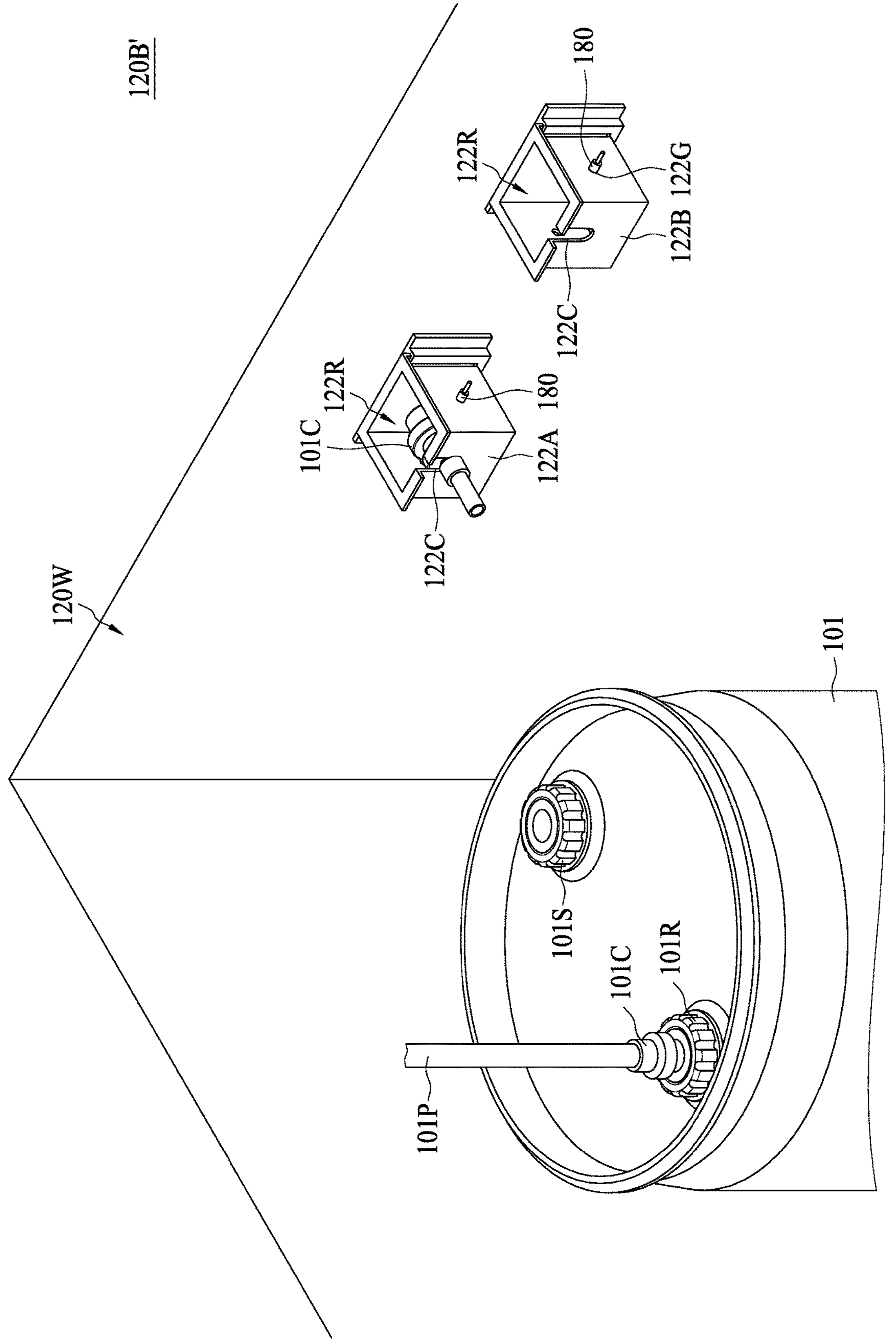
FIG. 8C is a perspective view showing an interlock apparatus under a third status, in accordance with some embodiments of the present disclosure.

The interlock apparatus 120B' subsequently discussed in FIG. 8A to FIG. 8C is similar to the interlock apparatus 120B discussed in FIG. 4A to FIG. 4F, the difference resides in that the interlock apparatus 120B' discussed in FIG. 8A to FIG. 8C utilizes the aforesaid fixture 122C configured on a sidewall of the leakage container 122 to temporarily couple to (or accommodate) connectors 101C of the tubing 101P. The operations discussed in FIG. 1A to FIG. 2C and FIG. 4A to FIG. 4F can be applied to the interlock apparatus 120B' discussed in FIG. 8A to FIG. 8C.

Referring to FIG. 8A, FIG. 8A is a perspective view showing an interlock apparatus under a first status, in accordance with some embodiments of the present disclosure. The interlock apparatus 120B' subsequently discussed in FIG. 8A to FIG. 8C is similar to the interlock apparatus 120B discussed in FIG. 4A to FIG. 4F, the difference resides in that each of the leakage container 122 may be configured to have a through hole 122G so that the proximity sensor 180 can be at least partially or completely disposed outside of the leakage container 122, thus would not be contaminated or corroded by chemical. In some of the embodiments, the proximity sensor 180 penetrates a sidewall of the leakage container 122. In some alternative embodiments, the proximity sensor 180 is apart from the through hole 122G configured on the leakage container 122.

Similar to the discussion in FIG. 4D, when the tubings 101P are still connected to the used chemical container 101, the tubings 101P are not coupled to the interlock apparatus 120B, wherein the status of the interlock apparatus 120B' without coupling to any tubing 101P can be referred to as a first status. As discussed in FIG. 4A to FIG. 4C, the proximity sensors 180 are configured to determine the status of the interlock apparatus 120B'. For example, when each of the proximity sensor 180 does not detect the presence of corresponding tubing 101P (in some embodiments, such as a connector 101C of the tubing 101P), a first signal is transmitted to the controller 103, and the controller 103 can obtain the first signal indicating that the tubing 101P is currently not coupled to the interlock apparatus 120B'. In some embodiments, the determining operation performed by the proximity sensor 180 may be initiated prior to removing the tubing 101P from the used chemical container 101, and ends until the supplying of chemical. In some other alternative embodiments, the determining operation performed by the proximity sensor 180 may be normally active so the determination is continuously performed.

Referring to FIG. 8B, FIG. 8B is a perspective view showing an interlock apparatus under a second status, in accordance with some embodiments of the present disclosure. Similar to the discussion in FIG. 4E, after coupling the tubing 101P removed from the used chemical container 101 are coupled to the interlock apparatus 120B', the connectors 101C is at a position that can be detected by the proximity sensor 180 (i.e. within the predetermined ranges of the sensing distance thereof). Under the circumstances of every tubing 101P removed from the used chemical container 101 are coupled to the interlock apparatus 120B' (herein referred to as the interlock apparatus 120B' being under a second status), a second signal is transmitted to the controller 103, and the controller 103 can obtain the second signal indicating that at least one of the tubing 101P is currently not coupled to the used chemical container 101 or the next chemical container 101. In some embodiments, the first signal may be terminated when the interlock apparatus 120B' becomes second status.

Referring to FIG. 8C, FIG. 8C is a perspective view showing an interlock apparatus under a third status, in accordance with some embodiments of the present disclosure. Similar to the discussion in FIG. 3F, under the circumstances of at least one of the tubing 101P removed from the used chemical container 101 is still coupled to the interlock apparatus 120B' (herein referred to as the interlock apparatus 120B' being in third status), the second signal is transmitted to the controller 103, and the controller 103 can obtain the second signal indicating that at least one of the tubing 101P is currently not coupled to the used chemical container 101 or the next chemical container 101. In some embodiments, the first signal may be terminated when the interlock apparatus 120B' becomes third status.

On the other hand, when each of the tubing 101P coupled to the interlock apparatus 120B' are removed, the interlock apparatus 120B' would be become first status (discussed in FIG. 8A) as the proximity sensor 180 does not detect the presence of the tubing 101P, thereby transmitting the first signal to the controller 103. In some embodiments, when the interlock apparatus 120B' is changed from second status or third status to first status, the first signal is triggered and the second signal is terminated.

In the embodiments, the detectable feature 101T attached to the tubing 101P (and/or the next chemical container 101) will be determined, confirmed or scanned again for the operator to confirm that each of the tubing 101P are properly connected to the next chemical container 101. A double check signal may be sent to the controller 103 to indicate that the operator finished the connection between the tubing 101P and the next chemical container 101.

The aforementioned multi-step foolproof mechanism of the interlock apparatus 120B' includes that the controller may receive a first signal before the beginning of replacement operation, followed by a second signal after coupling at least one of the tubing 101P to the interlock apparatus 120B', followed by the first signal after every tubing 101P coupled to the interlock apparatus 120B', and a double check signal after confirming the connection between the tubing 101P and the next chemical container 101.

After the operator believes that every tubing 101P are properly connected to the next chemical container 101, the operator can transmit a supply signal to the controller 103 in order to instruct the next chemical container 101 to supply chemical. In the scenario of either the double check signal or the first signal subsequent to the second signal is not obtained, the interlock mechanism would be activated as the controller 103 may either receive or generate a cancellation signal for instructing to cease (or not to execute) the supply operation, thereby preventing the chemical from being supplied and leaked out. Alternatively, when the controller 103 still detects or obtains the second signal, the controller 103 may either receive or generate a cancellation signal for instructing to cease (or not to execute) the supply operation, thereby preventing the chemical from being supplied and leaked out.

In the cases of the controller 103 receives both of the double check signal and the first signal subsequent to the second type signal, the controller 103 execute the supply operation of the next chemical container 101, and the chemical 199 starts flowing through the suction port 101S. Similar to the previous discussion in FIG. 1A to FIG. 1D and FIG. 2A, the circulation of the chemical 199 in the tubing 101P can be monitored.

In some other alternative embodiments with another approach, the interlock apparatus 120 can also be disposed on each of the chemical container 101 instead of the side proximal to the leakage container 122 or the fixture 121, such as next to the position of the suction port 101S and the return port 101R. For example, the interlock apparatus 120 disposed on the next chemical container 101 (or configured to monitor the next chemical container 101) may determine that whether each of the tubing 101P are connected to the next chemical container 101. This would be a factor for foolproof interlock that decides whether the interlock apparatus 120 would allow the chemical supply instruction or cancel the chemical supply instruction. In some embodiments, this approach can also be incorporated to any embodiments discussed in FIG. 1A to FIG. 8C so that the interlock is stricter and more accurate.

The present disclosure provides multi-step fool-proof mechanism of the interlock apparatus 120 for chemical container replacement operation. Particularly, it is not uncommon that operator instructed the chemical supply system 100 to start supplying chemical prior to properly connecting all of the tubing 101P (originally connected to a used chemical container 101) to the next chemical container 101. The interlock apparatus 120 provides mechanism and methods for tracing the position of each of the tubing 101P and would cancel the chemical supply instruction when at least one of the tubing 101P is not connected to the next chemical container 101.

FIG. 3A to FIG. 3F provides an interlock apparatus 120A incorporating optical sensor to determine the status of the interlock apparatus 120A. In some embodiments, the optical path of the radiation emitted from the emitter 170E toward the receiver 170R passes the intended locations for placing the tubing 101P or the connector 101C of the tubing 101P when exchanging the chemical containers, thus the optical sensor can be utilized to monitor the relative position between the tubing 101P and the leakage container 122 or the relative position between the tubing 101P and the fixture 121. In some cases, the emitter 170E and the receiver 170R may efficiently determine multiple tubing 101P aligned along a direction when exchanging the chemical containers.

FIG. 4A to FIG. 4F provides an interlock apparatus 120B incorporating proximity sensor to determine the status of the interlock apparatus 120B. In some embodiments, the proximity sensor 180 can determine whether the tubing 101P is coupled to the interlock apparatus 120B when exchanging the chemical containers. In some embodiments, the capacitive sensors are utilized as proximity sensors 180. The capacitive sensors may possess improved accuracy or better reliability, anti-corrosion and the determination distance thereof may be adjustable. In the cases of the chemical supply chamber 101M has a compact configuration or the tubing 101P are routed in complicated way, the interlock apparatus 120B implementing the proximity sensor can be used.

FIG. 5A to FIG. 5F provides an interlock apparatus 120C incorporating electrical switch and a determination circuit 190C to determine the status of the interlock apparatus 120C. In some embodiments, the connection or disconnection between the first portion 190A and the second portion 190B of the electrical switch (such as reed switch, electromagnetic switch, piezoelectric sensor, or the like) indicates whether the tubing 101P is coupled to the interlock apparatus 120C or not. Furthermore, the second portion 190B can be disposed over the auxiliary fixture 121F, wherein the auxiliary fixture 121F can be removed from the tubing 101P thus the same second portion 190B of the electrical switch can be used in other chemical container replacement operations.

FIG. 7A to FIG. 7B provides an interlock apparatus 120A' incorporating optical sensor to determine the status of the interlock apparatus 120A'. In some embodiments, the optical path of the radiation emitted from the emitter 170E toward the receiver 170R passes the intended locations for placing the tubing 101P or the connector 101C of the tubing 101P when exchanging the chemical containers, thus the optical sensor can be utilized to monitor the relative position between the tubing 101P and the leakage container 122 or the relative position between the tubing 101P and the fixture 121. The interlock apparatus 120A' includes a fixture 122C configured on a sidewall of the leakage container 122. In some embodiments, the fixture 122C can be a recess configured to temporarily couple to or accommodate connectors 101C of the tubing 101P. In some of the embodiments, the fixture 122C can be configured at a position requiring less extent of bending the tubing 101P.

FIG. 8A to FIG. 8C provides an interlock apparatus 120B' incorporating proximity sensor to determine the status of the interlock apparatus 120B'. In some embodiments, the proximity sensor 180 can determine whether the tubing 101P is coupled to the interlock apparatus 120B' when exchanging the chemical containers. In some embodiments, the capacitive sensors are utilized as proximity sensors 180. The capacitive sensors may possess improved accuracy or better reliability, anti-corrosion and the determination distance thereof may be adjustable. In the cases of the chemical supply chamber 101M has a compact configuration or the tubing 101P are routed in complicated way, the interlock apparatus 120B' implementing the proximity sensor can be used. The interlock apparatus 120B' further includes a fixture 122C configured on a sidewall of the leakage container 122. In some embodiments, the fixture 122C can be a recess configured to temporarily couple to or accommodate connectors 101C of the tubing 101P. In some of the embodiments, the fixture 122C can be configured at a position requiring less extent of bending the tubing 101P.

Furthermore, a double check operation is utilized to complement the sensor for detecting the presence of the tubing 101P proximal to the leakage container 122 or the fixture 121. Such confirmation step prevent the operator from forgetting to connect the tubing 101P to the next chemical container 101 even after removing the tubing 101P from the interlock apparatus 120. On the other hand, the interlock apparatus 120 prevent the operators from mistakenly or intentionally bypassing proper double check operation, for example, directly scans the detectable feature 101T (such as bar code, QR code, marking or serial numbers) but fails to connect the tubing 101P to the next chemical container 101. In addition, the auxiliary fixture 121F or the leakage container 122 can be implemented to facilitate the application of the interlock apparatus 120 (including interlock apparatus 120A, 120B, or 120C).

The present application can be applied to various industries such as factory, laboratory or fabrication lab that requires storage of chemical.

Some embodiments of the present disclosure provide a chemical supply system, including a chamber, a tubing extending into the chamber, an interlock apparatus, including a fixture for fastening the tubing, and means for determining whether the tubing is fastened by the fixture.

Some embodiments of the present disclosure provide a method for chemical container exchange, including detaching a tubing from a first chemical container in a chamber, coupling the tubing to an interlock apparatus, positioning a next chemical container different from the first chemical container in the chamber, wherein the next chemical container contains chemical, and obtaining a status of the interlock apparatus.

Some embodiments of the present disclosure provide a method for chemical container exchange, including detaching a tubing from a first chemical container in a chamber, coupling the tubing to an interlock apparatus, placing a next chemical container different from the first chemical container in the chamber, obtaining a first signal when the interlock apparatus is under a first status, obtaining a second signal when the interlock is under a second status, transmitting a supply instruction to a controller, and supplying chemical from the next chemical container when the first signal is received.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for chemical container exchange, comprising:
- detaching a tubing from a first chemical container in a chamber;
- coupling the tubing to an interlock apparatus;
- positioning a next chemical container different from the first chemical container in the chamber, wherein the next chemical container contains chemical;
- obtaining a status of the interlock apparatus, comprising
  - obtaining a first signal when the interlock apparatus is under a first status; and
  - obtaining a second signal when the interlock is under a second status;
- transmitting a supply instruction to a controller; and
- supplying chemical from the next chemical container when the first signal is received.

2. The method of claim 1, wherein obtaining the status of the interlock apparatus comprises: determining a relative position between the interlock apparatus and the tubing.

3. The method of claim 1, further comprising:
- ceasing the supply of chemical when the interlock apparatus is under a second status.

4. The method of claim 1, further comprising obtaining a double check signal from a detectable feature on the tubing or the next chemical container.

5. The method of claim 1, further comprising fastening the tubing to an auxiliary fixture prior to coupling the tubing to the interlock apparatus.

6. The method of claim 5, further comprising:
decoupling the tubing from the interlock apparatus and;
detaching the auxiliary fixture from the tubing after decoupling the tubing from the interlock apparatus.

7. A method for chemical container exchange, comprising:
detaching a tubing from a first chemical container in a chamber;
coupling the tubing to an interlock apparatus;
placing a next chemical container different from the first chemical container in the chamber;
obtaining a first signal when the interlock apparatus is under a first status;
obtaining a second signal when the interlock is under a second status;
transmitting a supply instruction to a controller; and
supplying chemical from the next chemical container when the first signal is received.

8. The method of claim 7, further comprising obtaining a double check signal with a detectable feature on the next chemical container.

9. The method of claim 8, wherein supplying chemical from the next chemical container comprises: checking if the double check signal is received.

10. The method of claim 7, further comprising fastening an auxiliary fixture to the tubing prior to coupling the tubing to the interlock apparatus.

11. The method of claim 10, further comprising removing the auxiliary fixture after placing the next chemical container in the chamber.

12. A method for chemical container exchange, comprising:
transmitting a first signal to a controller when an interlock apparatus is under a first status that a tubing is not coupled to the interlock apparatus in a chamber;
detaching the tubing from a first chemical container and coupling the tubing to the interlock apparatus;
replacing the first chemical container with a second chemical container; and
transmitting a second signal to the controller when the interlock apparatus is under a second status that the tubing is coupled to the interlock apparatus.

13. The method of claim 12, wherein the interlock apparatus comprises an emitter and a receiver being held proximal to an inner sidewall of the chamber, and the emitter is configured to emit a radiation to be received by the receiver.

14. The method of claim 13, the first signal is transmitted to the controller when the radiation is received by the receiver, and the second signal is transmitted the controller when the radiation is not received by the receiver.

15. The method of claim 12, wherein the interlock apparatus comprises an electrical switch being held proximal to an inner sidewall of the chamber, wherein the first signal is transmitted to the controller when a first portion of the electrical switch placed on a fixture on the inner sidewall is coupled to a second portion of the electrical switch placed on an auxiliary fixture configured to hold the tubing to the fixture.

16. The method of claim 12, wherein the interlock apparatus comprises a proximity sensor being hold proximal to an inner sidewall of the chamber, wherein the first signal is transmitted to the controller when the proximity sensor does not detect a presence of the tubing.

17. The method of claim 12, further comprising:
decoupling the tubing from the interlock apparatus; and
connecting the tubing to the second chemical container after transmitting the second signal.

18. The method of claim 12, further comprising:
supplying a chemical when the interlock apparatus is under the first status; and
ceasing the supply of chemical when the interlock apparatus is under the second status.

19. The method of claim 12, wherein replacing the first chemical container with the second chemical container when the first chemical container is substantially empty or a remaining amount of chemical in the first chemical container is less than a predetermined amount, and an amount of chemical in the second chemical container is greater than the predetermined amount.

20. The method of claim 12, wherein the interlock apparatus comprises a leakage container on an inner sidewall of the chamber, configured to hold the tubing connected to a connector, wherein the connector allows the tubing to be fastened over a suction port or a return port of the chemical container.

* * * * *